(12) United States Patent
Hsu

(10) Patent No.: US 9,490,805 B2
(45) Date of Patent: Nov. 8, 2016

(54) LOW POWER DRIVER WITH PROGRAMMABLE OUTPUT IMPEDANCE

(71) Applicant: Integrated Device Technology, Inc., San Jose, CA (US)

(72) Inventor: John Hsu, Sunnyvale, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 14/475,544

(22) Filed: Sep. 2, 2014

(65) Prior Publication Data

US 2016/0065211 A1 Mar. 3, 2016

(51) Int. Cl.
*H03K 19/00* (2006.01)
*H03K 19/003* (2006.01)
*H03K 19/0185* (2006.01)

(52) U.S. Cl.
CPC .... *H03K 19/0005* (2013.01); *H03K 19/00361* (2013.01); *H03K 19/01855* (2013.01); *H03K 19/018585* (2013.01)

(58) Field of Classification Search
CPC ............... H03K 19/0005; H03K 19/00361; H03K 19/018585; H04L 25/0278; H04L 25/0298
USPC .................. 326/30; 327/108; 365/189.05
See application file for complete search history.

(56) References Cited

U.S. PATENT DOCUMENTS

| | | | | |
|---|---|---|---|---|
| 5,426,383 A * | 6/1995 | Kumar | ............. | H03K 19/09441 326/119 |
| 6,054,881 A * | 4/2000 | Stoenner | ............. | H04L 25/0298 326/30 |
| 6,329,836 B1 * | 12/2001 | Drost | ............. | H03K 5/01 326/30 |
| 6,836,143 B2 * | 12/2004 | Song | ............. | H04L 25/0298 326/30 |
| 7,385,414 B2 * | 6/2008 | Kim | ............. | H03K 19/0005 326/30 |
| 7,741,866 B2 * | 6/2010 | Krishnan | ....... | H03K 19/018585 326/30 |
| 8,570,063 B2 | 10/2013 | Grunzke et al. | | |
| 2002/0053923 A1 * | 5/2002 | Kim | ............. | H03K 19/0005 326/30 |
| 2003/0122593 A1 | 7/2003 | Volk et al. | | |
| 2004/0119497 A1 * | 6/2004 | Roy | ............. | H03K 19/0005 326/50 |
| 2006/0066354 A1 | 3/2006 | Isik et al. | | |
| 2008/0106301 A1 * | 5/2008 | Fukushi | ............. | H03K 19/0005 326/82 |
| 2010/0033210 A1 * | 2/2010 | Baek | ............. | H03K 19/018528 326/82 |
| 2014/0159769 A1 * | 6/2014 | Hong | ............. | H03K 19/0005 326/30 |

OTHER PUBLICATIONS

Boni, et al., "LVDS I/O Interface for Gb/s-per-Pin Operation in 0.35-um CMOS", IEEE Journal of Solid State Circuits, vol. 36, No. 4, Apr. 2001, pp. 1-6.

* cited by examiner

*Primary Examiner* — Dylan White
(74) *Attorney, Agent, or Firm* — Glass & Associates; Kenneth Glass; Mark Peloquin

(57) ABSTRACT

A programmable low power driver permits an output impedance of the driver to be programmed. Programmability permits the driver output impedance to match an impedance of a transmission line that is connected thereto. The low power driver includes a first driver output and a plurality of driver legs. The programmable low power driver is configured to electrically couple one or more driver legs of the plurality of driver legs to the first driver output to establish an output impedance for the driver.

22 Claims, 11 Drawing Sheets

LOW POWER DRIVER WITH PROGRAMMABLE OUTPUT IMPEDANCE

BACKGROUND OF THE INVENTION

1. Field of Invention

The invention relates generally to a low power driver, and more specifically to apparatuses and methods for programming the output impedance of the driver.

2. Art Background

Integrated circuits (IC) contain drivers which are used to transmit clock and data signals over transmission lines, such as an internal trace of an IC. The output impedance of the driver needs to match the impedance of the transmission line to which the driver is attached. The application dependant nature of IC design requires different impedances for a given trace line within an IC. The impedance of a given trace line can change with the application of the IC. The impedance of the driver must match the impedance of the trace line. From an IC manufacturing perspective it is desirable to use a single driver design for a number of different IC applications. To this end, off chip resistors have been used to adjust the output impedance of the driver to the specific impedance presented by the trace line. This solution is time and material intensive, resulting in increased cost to the IC manufacturer. This presents a problem.

An approach which avoids off chip resistors requires a specific IC chip for each output impedance of interest. This approach is also expensive requiring a large inventory of different chips which are costly to produce. This presents a problem.

SUMMARY

In various embodiments, a programmable low power driver includes a first driver output, a first programmable driver leg and a second programmable driver leg. The first programmable driver leg has a pull-up half and a pull-down half. The pull-up half is electrically coupled between a supply voltage and the first driver output. The pull-up half is electrically coupled to receive a signal and a first control signal. The pull-down half is electrically coupled between an internal ground and the first driver output. The pull-down half is electrically coupled to receive an inversion of the signal and the first control signal. A second programmable driver leg has a pull-up half and a pull-down half. The pull-up half is electrically coupled between the supply voltage and the first driver output. The pull-up half is electrically coupled to receive the signal and a second control signal. The pull-down half is electrically coupled between the internal ground and the first driver output. The pull-down half is electrically coupled to receive the inversion of the signal and the second control signal. The first programmable driver leg contributes to a termination impedance of the driver when the first control signal is high and does not contribute to the termination impedance when the first control signal is low. The second programmable driver leg contributes to the termination impedance of the driver when the second control signal is high and does not contribute to the termination impedance when the second control signal is low.

A programmable low power driver includes an inverter having an input and an output. The inverter is configured to receive an input signal and to output an inverted signal, the inverted signal is an inversion of the input signal. The low power driver further includes a first driver output. A first plurality of programmable lower termination resistors$_i$, where the first plurality have a range 1 through n with index i, n is equal to or greater than two, the first plurality further includes a termination resistor$_i$ having a first end and a second end, the first end is electrically coupled to an internal ground. The first plurality further includes a logical element$_i$, having a first input, a second input, and an output. The first input is electrically coupled to receive the inverted signal and the second input is electrically coupled to receive a control signal$_i$. The first plurality further includes an NMOS device$_i$ having a source, a drain, and a gate. The gate is connected to the output of the logical element$_i$. The drain is electrically coupled to the first driver output and the source is electrically coupled to the second end of the termination resistor$_i$. A first plurality of programmable upper termination resistor$_i$, where the first plurality have range 1 through n is equal to or greater than two, the first plurality further includes a termination resistor$_i$ having a first end and a second end. The first end is electrically coupled to a supply voltage. The first plurality of programmable upper termination resistor$_i$, further includes a logical element$_i$, having a first input, a second input, and an output. The first input is electrically coupled to receive the signal and the second input is electrically coupled to receive a control signal$_i$. The first plurality of programmable upper termination resistor$_i$, further includes an NMOS device$_i$ having a source, a drain, and a gate. The gate is connected to the output of the logical element$_i$. The drain is electrically coupled to the second end of the termination resistor$_i$, and the source is electrically coupled to the first driver output.

In other embodiments, an integrated circuit device includes an inverter having an input and an output. The inverter is configured to receive a signal and to output an inverted signal, where the inverted signal is an inversion of the signal. The integrated circuit device further includes a first logical element having a first input, a second input, and an output, the first input is electrically coupled to receive the inverted signal and the second input is electrically coupled to receive a first control signal. A first termination resistor having a first end and a second end, the first end of the first termination resistor is electrically coupled to an internal ground. A first switching element having a gate, a source, and a drain, the source of the first switching element is electrically coupled to the second end of the first termination resistor. The drain of the first switching element is electrically coupled to the first driver output. The gate of the first switching element is electrically coupled to the output of the first logical element. A second logical element having a first input, a second input, and an output. The first input is electrically coupled to receive the signal and the second input of the second logical element is electrically coupled to receive the first control signal. A second termination resistor having a first end and a second end. The first end of the second termination resistor is electrically coupled to a supply voltage. A second switching element having a gate, a source, and a drain. The drain of the second switching element is electrically coupled to the second end of the second termination resistor. The source of the second switching element is electronically coupled to the first driver output. The gate of the second switching element is electrically coupled to the output of the second logical element. A third logical element having a first input, a second input, and an output. The first input of the third logical element is electrically coupled to receive the inverted signal and the second input of the third logical element is electrically coupled to receive a second control signal. A third termination resistor having a first end and a second end. The first end of the third termination resistor is electrically coupled to the internal ground. A third switching element having a gate, a source, and a drain. The source of the third switching element is electrically coupled to the second end of the third termination resistor. The drain of the third switching element is electrically coupled to the first driver output. The gate of the third switching element is electrically coupled to the output of the third logical element. A fourth logical element having a first input, a second input, and an output. The first input of the fourth logical element is electrically coupled to receive the signal, and the second input of the fourth logical element is electrically coupled to receive the second control signal. A fourth termination resistor having a first end and a second end, the first end of the fourth termination resistor is electrically coupled to the supply voltage. A fourth switching element having a gate, a source, and a drain. The source of the fourth switching element is electrically coupled to the first driver output. The drain of the fourth switching element is electrically coupled to the second end of the fourth termination resistor. The gate of the fourth switching element is electrically coupled to the output of the fourth switching element.

In other embodiments, a clock includes a clock circuit configured to generate a clock signal and a programmable low power driver. The programmable low power output driver has a first driver output and a plurality of driver legs each having different impedance. Each of the plurality of driver legs is electrically coupled to the clock circuit. The programmable low power driver is configured to receive the clock signal and an input indicating one or more of the plurality of driver legs. The programmable low power driver configured to electrically couple the indicated one or more of the plurality of driver legs to the first driver output and to generate at the first driver output an output clock signal which has an impedance corresponding to the impedance of the indicated one or more of the plurality of driver legs.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

DETAILED DESCRIPTION

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

A programmable output impedance driver is described. A plurality of output impedances can be obtained from a single integrated circuit (IC) using various embodiments of the invention.

Figure 1:
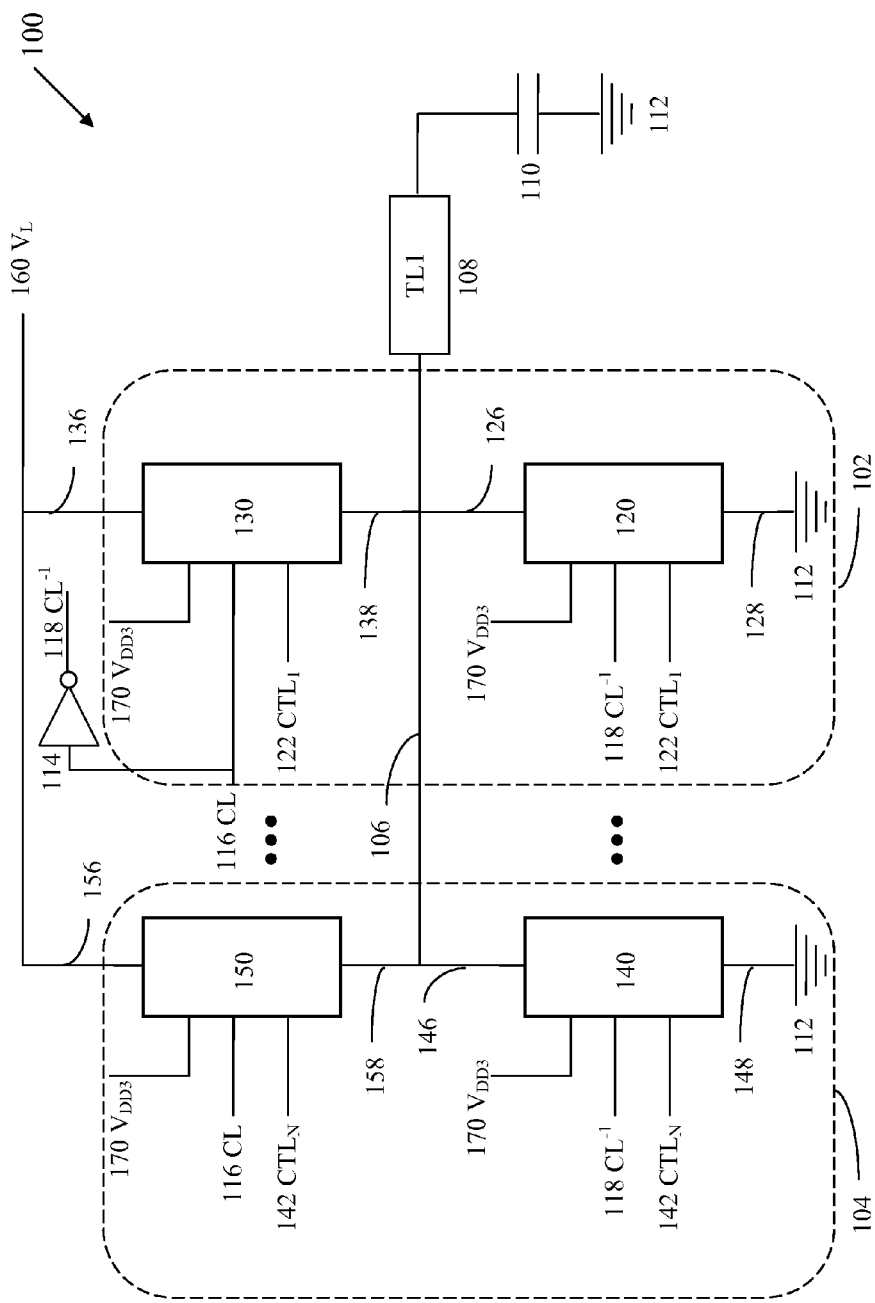
FIG. 1 illustrates an driver with programmable output impedance, according to embodiments of the invention.

FIG. 1 illustrates, generally at 100, a driver with programmable output impedance, according to embodiments of the invention. With reference to FIG. 1, a driver 100 terminates a driver output 106 with a first programmable driver leg 102 in parallel with a general number of N programmable driver legs indicated by the $N^{th}$ driver leg at 104. The driver 100 is electrically coupled to a transmission line 108. The transmission line 108 can be, for example, a trace on an integrated circuit (IC). A capacitive load 110 and an internal ground 112 terminate the end of the transmission line 108 opposite to the driver. A signal 116 is input to the driver. The signal 116 is also input into an inverter 114. The output of the inverter 114 is the inversion of the signal and is indicated at 118. The inverted signal is referred to synonymously herein as the inverted signal or the inversion of the signal.

The first programmable driver leg 102 includes a pull-down half 120 and a pull-up half 130. The pull-up half 130 is electrically coupled at 136 to a supply voltage 160 $V_L$ and at 138 to the driver output 106. The supply voltage 160 $V_L$ is provided by a reduced voltage power supply described below in FIG. 2. The pull-up half 130 has a first input with is electrically coupled to receive the signal 116 and a second input which is electrically coupled to receive a first control signal 122. The pull-down half 120 of the first programmable driver leg 102 is electrically coupled at 128 to the internal ground 112 and at 126 to the driver output 106. The pull-down half 120 has a first input with is electrically coupled to receive the inverted signal 118 and a second input which is electrically coupled to receive the first control signal 122. Both the pull-up half 130 and the pull-down half 120 receive voltage 170 $V_{DD3}$ as described below in conjunction with FIG. 2. Supply voltage 170 $V_{DD3}$ supplies power for logical elements contained in the programmable driver legs. The logical elements are described more fully below in the figures that follow.

Driver 100 includes a general number of N programmable driver legs. The $N^{th}$ leg is indicated at 104 and includes a pull-down half 140 and a pull-up half 150. The pull-up half 150 is electrically coupled at 156 to the supply voltage 160

$V_L$ and at 158 to the driver output 106. The pull-up half 150 has a first input with is electrically coupled to receive the signal 116 and a second input which is electrically coupled to receive an $N^{th}$ control signal 142. The pull-down half 140 is electrically coupled at 148 to the internal ground 112 and at 146 to the driver output 106. The pull-down half 140 has a first input with is electrically coupled to receive the inverted signal 118 and a second input which is electrically coupled to receive the $N^{th}$ control signal 142. Both the pull-up half 150 and the pull-down half 140 receive voltage $V_{DD3}$ at 170 as described below in conjunction with FIG. 2.

Control signals 122 through 142 are used to program an output impedance for the driver 100. For example, in one embodiment a control signal 122 causes the first driver leg 102 to contribute to the output impedance of the driver 100. The first driver leg 102 can also set the output impedance if the other control signals, e.g. 142 do not turn on the other driver legs. Thus, in operation a variety of output impedances can be programmed by transmission of the appropriate control signals to the N driver legs represented by 102 through 104. In practice, the output impedance of the driver 100 will be equal to the parallel sum of the driver legs that are programmed to contribute to the output impedance. The programmable output impedance techniques illustrated herein are applicable to both single ended and differentially configured applications.

In various embodiments, the driver 100 is implemented in an integrated circuit device, which may include an integrated circuit package containing the integrated circuit. In some embodiments, the driver 100 is implemented in a single integrated circuit die. In other embodiments, the driver 100 is implemented in more than one integrated circuit die of an integrated circuit device which may include a multi-chip package containing the integrated circuit. In various embodiments, a single semiconductor die can be factory programmed into different parts, each with their own output impedance. Alternatively, a semiconductor die containing the driver(s) can be programmed in the field.

Figure 2:
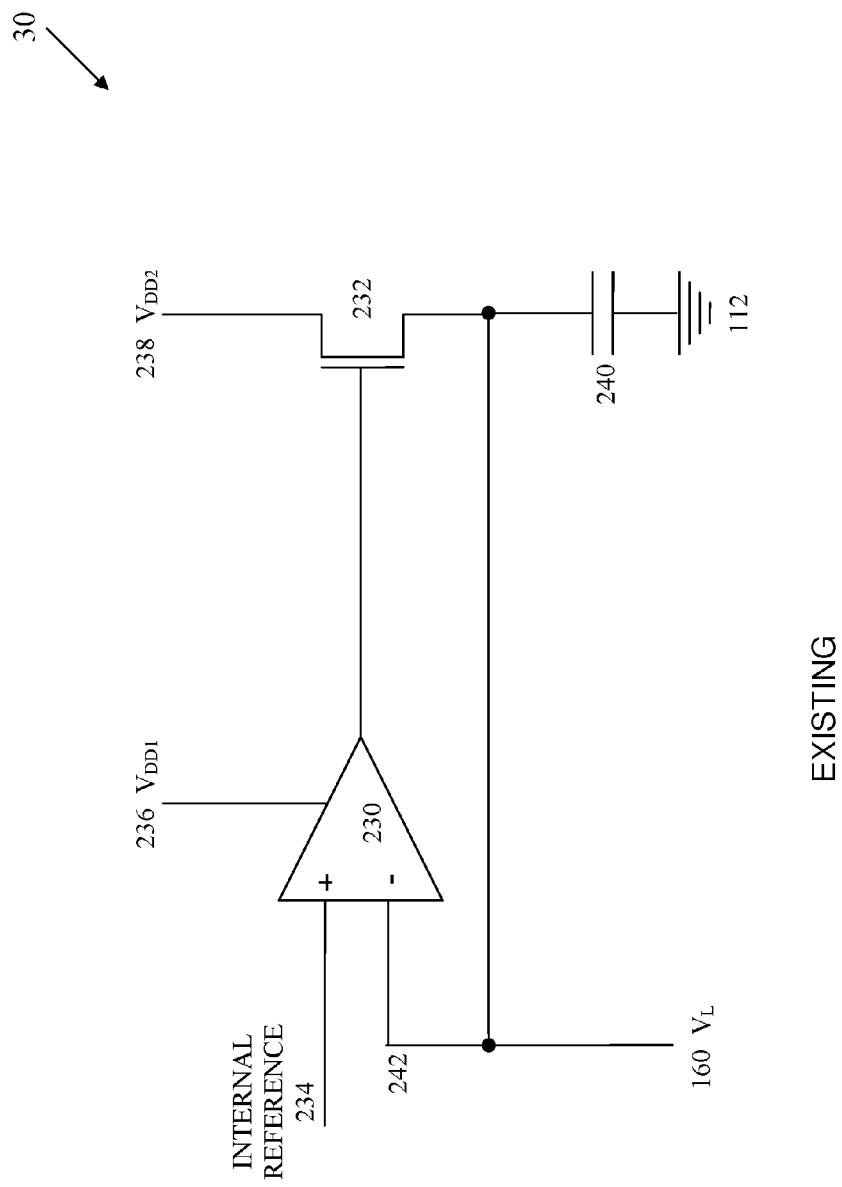
FIG. 2 illustrates a reduced voltage power supply.

FIG. 2 illustrates, generally at 30, a reduced voltage power supply. With reference to FIG. 2, a reduced voltage power supply is shown as described in U.S. Pat. No. 7,342,420, which is hereby incorporated by reference.

In various embodiments, the reduced voltage power supply 30 is implemented within the same integrated circuit (IC) as the driver 100. In some embodiments, one reduced voltage power supply 30 will supply a plurality of drivers 100 all on the same IC (i.e., on the same chip). In other embodiments, the power supply is on a different IC from the IC that the driver 100 or plurality of drivers 100 is on. In other embodiments, the reduced voltage power supply 30 is implemented in an integrated circuit device, which may include an integrated circuit package containing the integrated circuit. In some embodiments, the reduced voltage power supply 30 is implemented in a single integrated circuit die. In other embodiments, the reduced voltage power supply 30 is implemented in more than one integrated circuit die of an integrated circuit device which may include a multi-chip package containing the integrated circuit.

The reduced voltage power supply 30 is one of a series-regulated power supply and a switching-mode-regulated power supply. The reduced voltage power supply 30 receives power from an external power source such as a supply voltage ($V_{DD}$) (i.e., the rail voltage). As shown, an operational amplifier (op-amp) 230 receives an internal reference current (or voltage) 234 on its non-inverting input and outputs a signal to a field effect transistor (FET) 232. The internal reference may be a bandgap reference, a resistance voltage divider, an external reference, an external bandgap and the like. The FET 232 then provides a reduced voltage output $V_L$ at 160 to a high-side of the driver 100 and also as a feedback at 242 to the inverting input of op-amp 230. For example, a $V_{DD}$ of 3.3 volts may be controlled down to about 750 mV. Of course, other voltage reducing configurations may be utilized without departing from the teaching herein. For example the FET 232 may instead be a bipolar transistor and the like. An external capacitor $C_{EXT}$ at 240 is coupled between the feedback voltage and ground 112 to reduce line-noise, ripple and the like. Alternately, the external capacitor $C_{EXT}$ can be formed internally without departing from the teaching herein.

There is a first supply voltage $V_{DD1}$ that provides power for devices such as operational amplifiers 230 and the like. The first supply voltage $V_{DD1}$ may be 1.2 VDC, 1.5 VDC, 3.3 VDC, 5 VDC or the like. The reduced voltage source 30 receives a second supply voltage $V_{DD2}$ and outputs a regulated reduced voltage $V_L$ that is a lower voltage than the second supply voltage $V_{DD2}$. The second supply voltage $V_{DD2}$ may be the same as the first supply voltage $V_{DD1}$, may be derived from the first supply voltage $V_{DD1}$ or may be from a completely separate source. For example, the second supply voltage $V_{DD2}$ may be derived from a linear or switching power supply (not shown) that receives the first supply voltage $V_{DD1}$ and outputs a regulated voltage that is less than or greater than the first supply voltage $V_{DD1}$. Supply power for the logical elements is provided by a third supply voltage $V_{DD3}$. The third supply voltage $V_{DD3}$ may be the same as the first supply voltage $V_{DD1}$, may be derived from the first supply voltage $V_{DD1}$ or may be from a completely separate source. Preferably, the third supply voltage $V_{DD3}$ is greater than the reduced voltage $V_L$. $V_{DD1}$ and $V_{DD3}$ are greater than or equal to $V_{DD2}$. All three voltages $V_{DD1}$, $V_{DD2}$, and $V_{DD3}$ can be derived from the same source of power.

Figure 3:
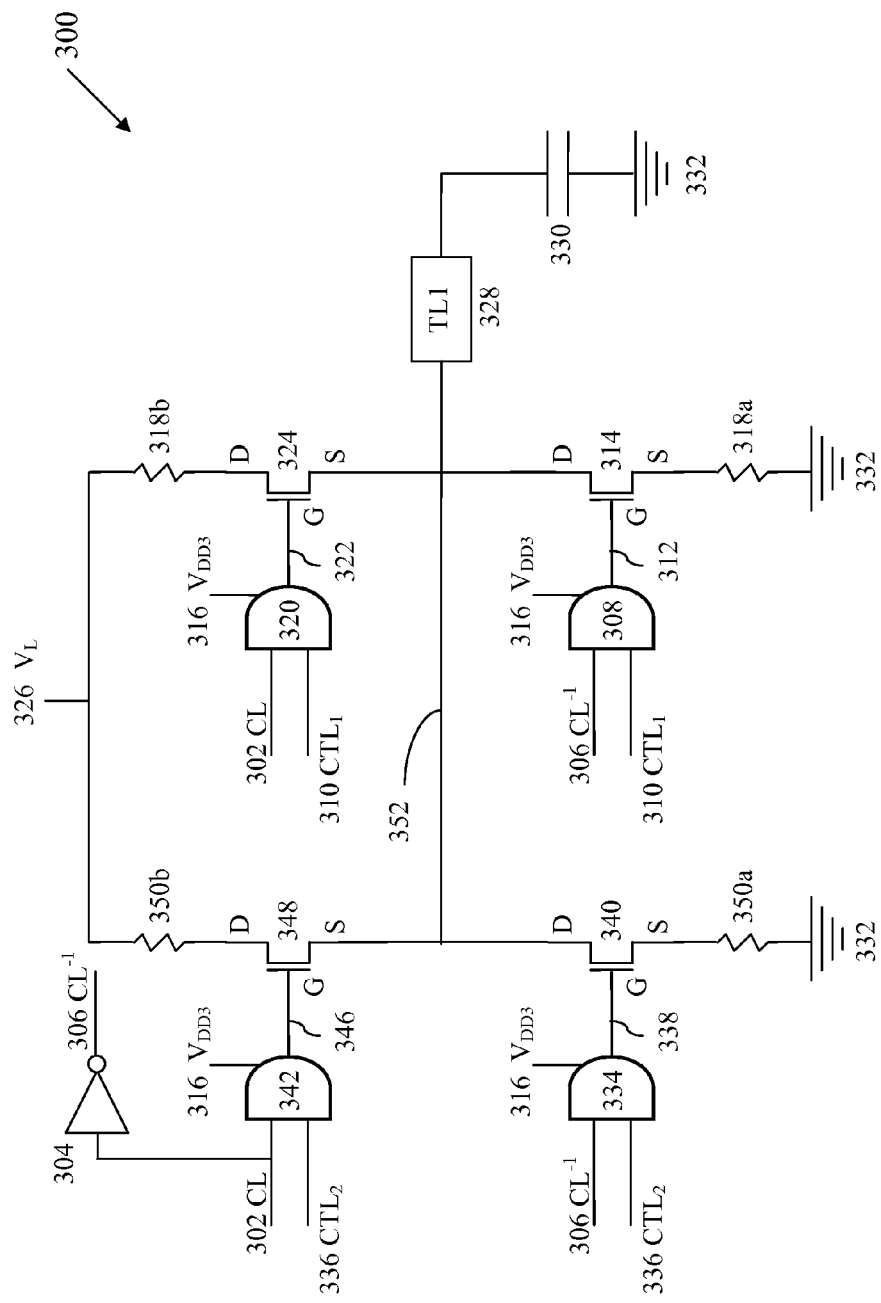
FIG. 3 illustrates a programmable output impedance utilizing two legs, according to embodiments of the invention.

FIG. 3 illustrates, generally at 300, a programmable output impedance utilizing two programmable driver legs, according to embodiments of the invention. With reference to FIG. 3, a first driver 300 is configured with two programmable driver legs in accordance with the previous teaching to provide an output impedance for a first driver output at 352. A signal 302 is electrically coupled to an inverter 304 to provide an inverted signal 306.

The driver 300 includes a first programmable driver leg which has a pull-down half and a pull-up half. The pull-down half includes a first logical element 308, a first n-type metal oxide semiconductor (NMOS) device 314 and a first termination resistor 318a. The first termination resistor 318a has a first end connected to an internal ground 332. The first NMOS device 314 has a source, a drain, and a gate. The source of the first NMOS device 314 is electrically coupled to the second end of the first termination resistor 318a. The drain the first NMOS device 314 is electrically coupled to the first driver output 352. The first logical element 308 has a first input which is electrically coupled to receive the inverted signal 306. The first logical element has a second input which is electrically coupled to receive a first control signal 310. An output 312 of the first logical element 308 is electrically coupled to the gate of the first NMOS device 314. Power at 316 $V_{DD3}$ is supplied to the first logical element 308.

The pull-up half, of the first programmable driver leg, includes a second logical element 320, a second NMOS device 324 and a second termination resistor 318b. The second termination resistor 318b has a first end connected to a supply voltage 326 $V_L$ as described above in conjunction with FIG. 2. The second NMOS device 324 has a source, a drain, and a gate. The drain of the second NMOS device 324 is electrically coupled to the second end of the second termination resistor 318b. The source the second NMOS device 324 is electrically coupled to the first driver output 352. The second logical element 320 has a first input which is electrically coupled to receive the signal 302. The second logical element 320 has a second input 310 which is electrically coupled to receive a first control signal 310. An output 322 of the second logical element 320 is electrically coupled to the gate of the second NMOS device 324. Power at 316 $V_{DD3}$ is supplied to the second logical element 320.

The second programmable driver leg has a pull-down half and a pull-up half. The pull-down half includes a third logical element 334, a third NMOS device 340 and a third termination resistor 350a. The third termination resistor 350a has a first end connected to the internal ground 332. The third NMOS device 340 has a source, a drain, and a gate. The source of the third NMOS device 340 is electrically coupled to the second end of the third termination resistor 350a. The drain the third NMOS device 340 is electrically coupled to the first driver output 352. The third logical element 334 has a first input which is electrically coupled to receive the inverted signal 306. The third logical element 334 has a second input which is electrically coupled to receive a second control signal 336. An output 338 of the third logical element 334 is electrically coupled to the gate of the third NMOS device 340. Power at 316 $V_{DD3}$ is supplied to the third logical element 334.

The pull-up half, of the second programmable driver leg, includes a fourth logical element 342, a fourth NMOS device 348 and a fourth termination resistor 350b. The fourth termination resistor 350b has a first end connected to the supply voltage 326 $V_L$ as described above in conjunction with FIG. 2. The fourth NMOS device 348 has a source, a drain, and a gate. The drain of the fourth NMOS device 348 is electrically coupled to the second end of the fourth termination resistor 350b. The source the fourth NMOS device 348 is electrically coupled to the first driver output 352. The fourth logical element 342 has a first input which is electrically coupled to receive the signal 302. The fourth logical element 342 has a second input which is electrically coupled to receive the second control signal 336. An output 346 of the fourth logical element 342 is electrically coupled to the gate of the fourth NMOS device 348. Power at 316 $V_{DD3}$ is supplied to the fourth logical element 342.

The first driver output 352 is electrically coupled to the first transmission line 328. The end of the first transmission line 328, opposite to the first driver output 352, is connected to capacitive load 330 and is terminated to an internal ground at 332. The signal 302 can be a timing signal such as a clock signal or it can represent a data signal. The two programmable driver legs contribute to the output impedance of the driver 300.

The logical elements 308, 320, 334, and 342 provide a logical AND function. Thus, AND gates can be used at 308, 320, 334, and 342 or other configurations of combinatorial logic can be used that realize an AND function. Thus, when both inputs are "high" or equal to "1" the output of the logical element is high or equal to "1." Conversely, when one input is high and the other input is low or both inputs are low the output is low. The control signals 310 and 336 can be set high to a value of "1" or low to a value of "0." The control signals are static values and are set depending on the values previously chosen for the termination resistors 318a, 318b, 350a, and 350b all of which is based on the desired impedance at 352. With two driver legs having termination resistor values of 318a and 350a three different output impedances can be obtained. A first output impedance, approximately equal to 318a, is obtained when the first control signal 310 is set high and the second control signal 336 is set low. A second output impedance, approximately equal to 350a, is obtained when the first control signal 310 is set low and the second control signal 336 is set high. A third output impedance, approximately equal to the parallel sum of 318a and 350a, is obtained when the first control signal 310 is set high and the second control signal 336 is set high.

The term "approximately equal" is used above to describe the output impedance obtained because of the variability inherent in semiconductor manufacturing processes. In practice, an actual design of an integrated circuit which implements an electrical circuit illustrated herein by the figures includes contributions of resistance from components such as the NMOS devices. The contribution of resistance from an NMOS device is typically small compared to the contribution of resistance from a resistor however at times due to such things as the variability of semiconductor manufacturing processes it becomes necessary to utilize the resistance imparted by components such as an NMOS device while omitting a corresponding termination resistor in order to achieve a certain resistance in a programmable leg. In various embodiments, a resistor can be excluded from the schematic representation of FIG. 3. Exclusion of a resistor changes the resistance of a given leg. An example of leaving one or more resistors out of one or more legs is given below in conjunction with FIG. 7.

In one embodiment, in operation when both the first and second control signals are set high, whenever logical elements 342 and 320 are on, 352 is pulled up to the reduced voltage 326 $V_L$. Whenever logical elements 334 and 308 are on, 352 is pulled to ground 332. When 352 is pulled high, to the reduced voltage 326 $V_L$, there is a current draw until 352 reaches a quiescent voltage with reduced voltage 326 $V_L$. But, there is not a continuous draw of current to ground as in the case of a system with terminating resistors. In another embodiment, the first control signal 310 is high and the second control signal 336 is low. Whenever logical element 320 is on, 352 is pulled up to the reduced voltage 326 $V_L$. Whenever logical element 308 is on, 352 is pulled down to ground 332. Similar operation results when the second control signal 336 is set high and the first control signal 310 is set low. Thus, an architecture for obtaining a low power programmable output impedance for a driver is described using embodiments of the invention for the single ended configuration of FIG. 3. These principles are extended to a differential configuration as shown in FIGS. 4A-4B.

In various embodiments, the driver 300 is implemented in an integrated circuit device, which may include an integrated circuit package containing the integrated circuit. In some embodiments, the driver 300 is implemented in a single integrated circuit die. In other embodiments, the driver 300 is implemented in more than one integrated circuit die of an integrated circuit device which may include a multi-chip package containing the integrated circuit.

The driver illustrated in FIG. 3 and in FIG. 4A-4B directly below, utilizes electrostatic discharge (ESD) protection which is parasitic to the NMOS structure. In other embodiments, illustrates in FIG. 5 and FIG. 6 a separate ESD structure is used to provide ESD protection.

Figure 4A:
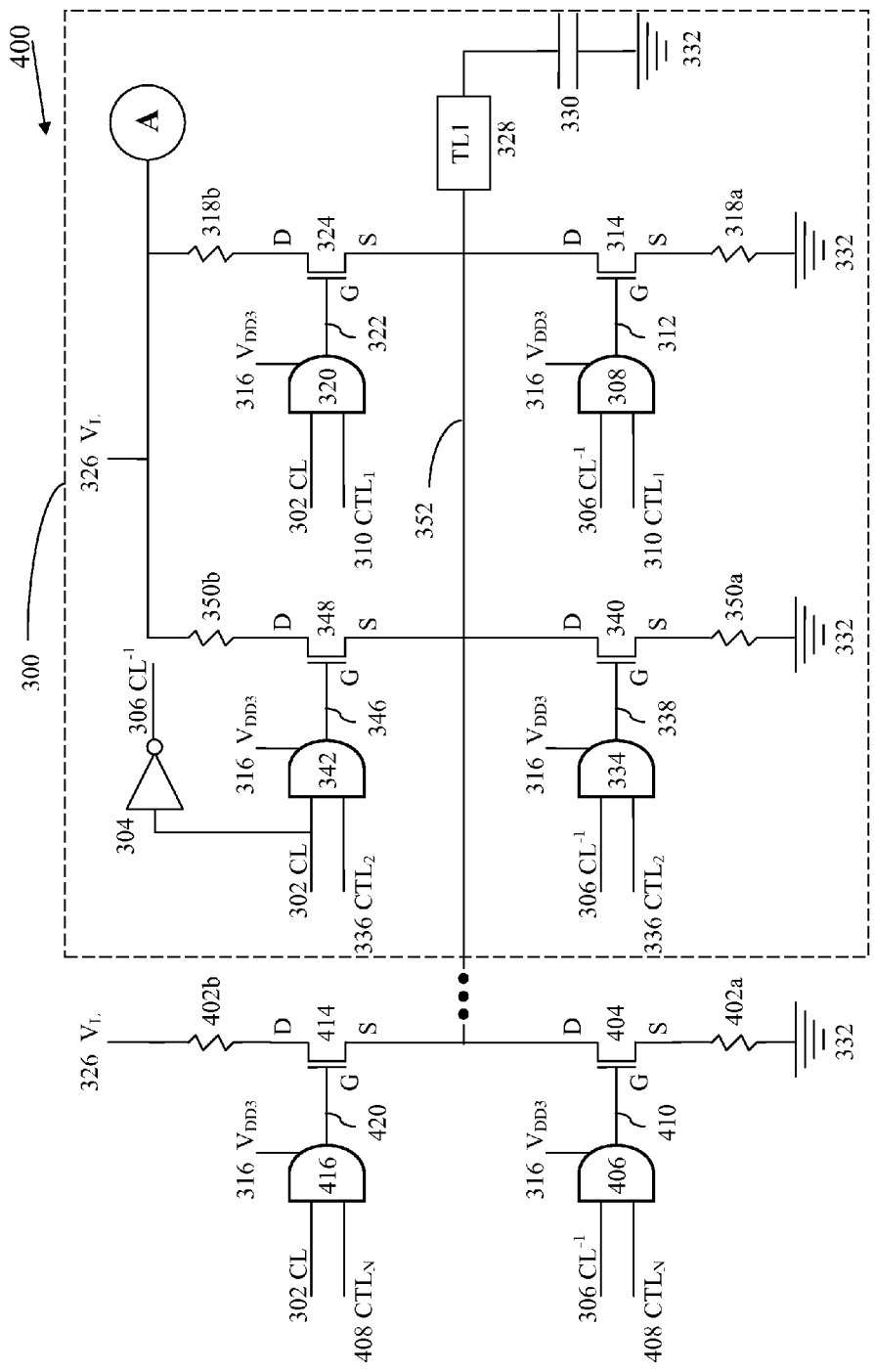
FIGS. 4A-4B illustrate a programmable output impedance with N driver legs for an driver used with a differential transmission line, according to embodiments of the invention.
Figure 4B:
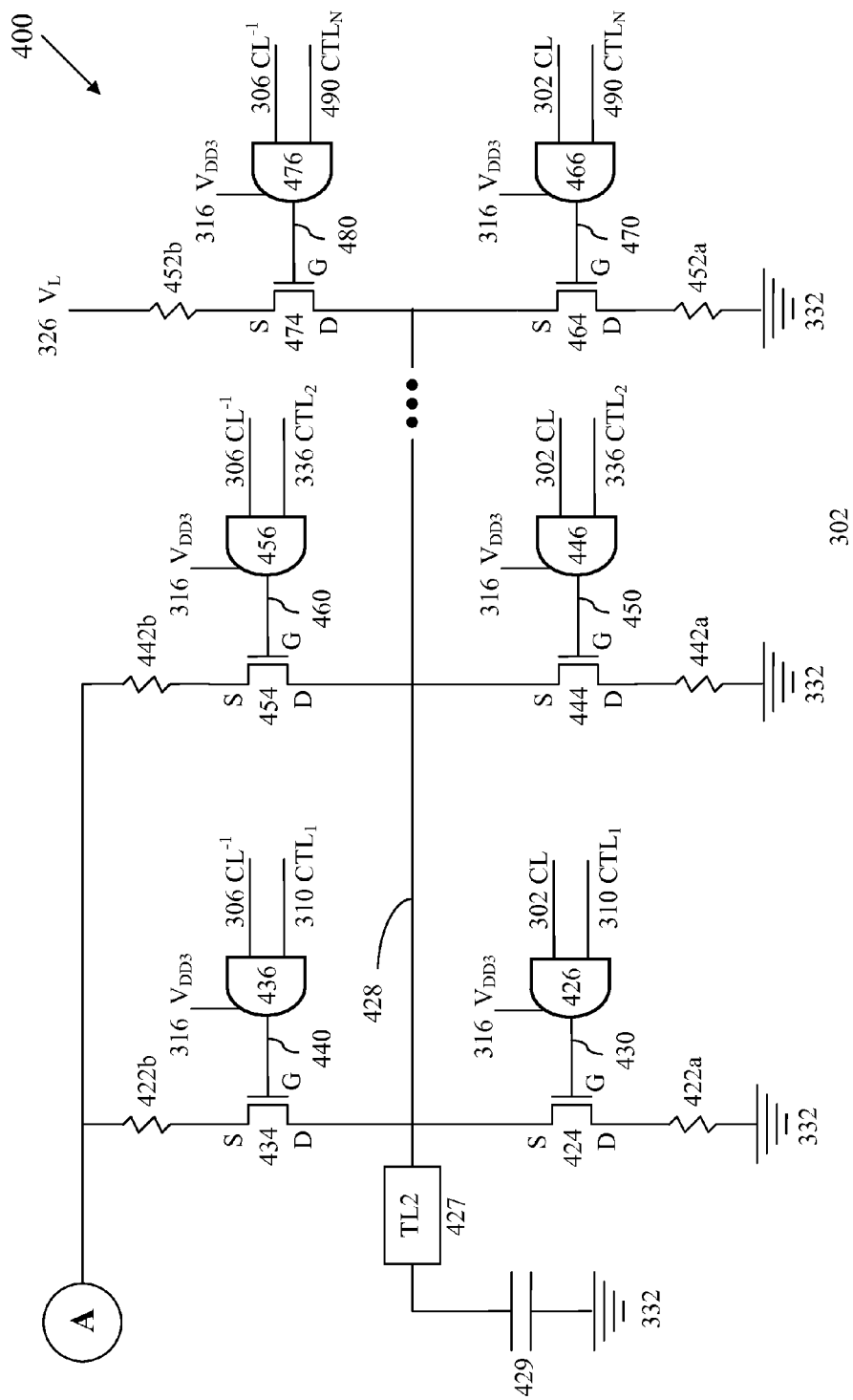

FIGS. 4A-4B illustrate programmable output impedance with generalization to N driver legs for a driver used with a differential transmission line, according to embodiments of the invention. With reference to FIGS. 4A-4B, the structure 300 for the first driver from FIG. 3 is repeated within FIGS. 4A-4B for clarity and simplicity in presentation. A driver 400 includes the first driver output 352 and a second driver output 428. As was previously described in FIG. 3, the first driver 300 includes first and a second programmable driver legs. The structure of 300 can be extended as needed to a general number of N programmable driver legs as is indicated with the addition of an $N^{th}$ programmable driver leg having a pull-down half and a pull-up half.

The pull-down half of the $N^{th}$ programmable driver leg includes a logical element 406, an NMOS device 404 and a termination resistor 402a. The termination resistor 402a has a first end connected to the internal ground 332. The NMOS device 404 has a source, a drain, and a gate. The source of the NMOS device 404 is electrically coupled to the second end of the termination resistor 402a. The drain the NMOS device 404 is electrically coupled to the first driver output 352. The logical element 406 has a first input which is electrically coupled to receive the inverted signal 306. The logical element 406 has a second input which is electrically coupled to receive an $N^{th}$ control signal 408. An output 410 of the logical element 406 is electrically coupled to the gate of the NMOS device 404. Power at 316 $V_{DD3}$ is supplied to the logical element 406.

The pull-up half, of the $N^{th}$ programmable driver leg, includes a logical element 416, an NMOS device 414 and a termination resistor 402b. The termination resistor 402b has a first end electrically coupled to the supply voltage 326 $V_L$ as described above in conjunction with FIG. 2. The NMOS device 414 has a source, a drain, and a gate. The drain of the NMOS device 414 is electrically coupled to the second end of the second termination resistor 402b. The source the NMOS device 414 is electrically coupled to the first driver output 352. The logical element 416 has a first input which is electrically coupled to receive the signal 302. The logical element 416 has a second input which is electrically coupled to receive the $N^{th}$ control signal 408. An output 420 of the logical element 416 is electrically coupled to the gate of the NMOS device 414. Power at 316 $V_{DD3}$ is supplied to the logical element 416.

The second driver output 428 is connected to one end of a second transmission line 427. The opposite end of the second transmission line 427 is electrically coupled to a capacitive load 429 and is terminated at 332 to the internal ground.

The driver 400 includes a 3rd programmable driver leg, a fourth programmable driver leg up to an $N^{th}$ programmable driver leg. Therefore, the resulting circuit for the driver 400 is symmetrical with respect to the first transmission line 328 and the second transmission line 428.

The nomenclature used to describe the structure in FIG. 3 is continued for the second transmission line 427, therefore the first programmable driver leg (used to terminate the second driver output 428) is referred to as the third programmable driver leg and the second programmable driver leg (used to terminate the second driver output 428) is referred to as the fourth programmable driver leg. In the context of FIG. 4, reference to the "number" of a programmable driver leg refers to the differential driver 400.

The driver 400 includes a third programmable driver leg which has a pull-down half and a pull-up half. The pull-down half includes a fifth logical element 426, a fifth NMOS device 424 and a fifth termination resistor 422a. The fifth termination resistor 422a has a first end connected to an internal ground 332. The fifth NMOS device 424 has a source, a drain, and a gate. The drain of the fifth NMOS device 424 is electrically coupled to the second end of the fifth termination resistor 422a. The source the fifth NMOS device 424 is electrically coupled to the second driver output 428. The fifth logical element 426 has a first input which is electrically coupled to receive the signal 302. The fifth logical element 426 has a second input which is electrically coupled to receive the first control signal 310. An output 430 of the fifth logical element 426 is electrically coupled to the gate of the fifth NMOS device 424. Power at 316 $V_{DD3}$ is supplied to the fifth logical element 426.

The pull-up half, of the third programmable driver leg, includes a sixth logical element 436, a sixth NMOS device 434 and a sixth termination resistor 422b. The sixth termination resistor 422b has a first end connected to a supply voltage 326 $V_L$ as described above in conjunction with FIG. 2. The sixth NMOS device 434 has a source, a drain, and a gate. The source of the sixth NMOS device 434 is electrically coupled to the second end of the sixth termination resistor 422b. The drain the sixth NMOS device 434 is electrically coupled to the second driver output 428. The sixth logical element 434 has a first input which is electrically coupled to receive the inverted signal 306. The sixth logical element 436 has a second input 310 which is electrically coupled to receive the first control signal 310. An output 440 of the sixth logical element 436 is electrically coupled to the gate of the sixth NMOS device 434. Power at 316 $V_{DD3}$ is supplied to the sixth logical element 434.

The driver 400 includes a fourth programmable driver leg which has a pull-down half and a pull-up half. The pull-down half includes a seventh logical element 446, a seventh NMOS device 444 and a seventh termination resistor 442a. The seventh termination resistor 442a has a first end connected to the internal ground 332. The seventh NMOS device 444 has a source, a drain, and a gate. The drain of the seventh NMOS device 444 is electrically coupled to the second end of the seventh termination resistor 442a. The source the seventh NMOS device 444 is electrically coupled to the second driver output 428. The seventh logical element 446 has a first input which is electrically coupled to receive the signal 302. The seventh logical element 446 has a second input which is electrically coupled to receive the second control signal 336. An output 450 of the seventh logical element 446 is electrically coupled to the gate of the seventh NMOS device 444. Power at 316 $V_{DD3}$ is supplied to the seventh logical element 446.

The pull-up half, of the fourth programmable driver leg, includes an eighth logical element 456, an eighth NMOS device 454 and a eighth termination resistor 442b. The eighth termination resistor 442b has a first end connected to a supply voltage 326 $V_L$ as described above in conjunction with FIG. 2. The eighth NMOS device 454 has a source, a drain, and a gate. The source of the eighth NMOS device 454 is electrically coupled to the second end of the eighth termination resistor 442b. The drain the eighth NMOS device 454 is electrically coupled to the second driver output 428. The eighth logical element 456 has a first input which is electrically coupled to receive the inverted signal 306. The eighth logical element 456 has a second input which is electrically coupled to receive the second control signal 336. An output 460 of the eighth logical element 456 is electrically coupled to the gate of the eighth NMOS device 454. Power at 316 $V_{DD3}$ is supplied to the eighth logical element 454.

Note that the first driver output 352 included N programmable driver legs. Similarly, the second driver output 428 includes N programmable driver legs. The pull-down half of the $N^{th}$ programmable driver leg for the second driver output 428 includes a logical element 466, an NMOS device 464 and a termination resistor 452a. The termination resistor 452a has a first end connected to the internal ground 332. The NMOS device 464 has a source, a drain, and a gate. The drain of the NMOS device 464 is electrically coupled to the second end of the termination resistor 452a. The source the NMOS device 464 is electrically coupled to the second driver output 428. The logical element 466 has a first input which is electrically coupled to receive the signal 302. The logical element 466 has a second input which is electrically coupled to receive the $N^{th}$ control signal 490. An output 470 of the logical element 466 is electrically coupled to the gate of the NMOS device 464. Power at 316 $V_{DD3}$ is supplied to the logical element 466.

The pull-up half, of the $N^{th}$ programmable driver leg, includes a logical element 476, an NMOS device 474 and a termination resistor 452b. The termination resistor 452b has a first end connected to a supply voltage 326 $V_L$ as described above in conjunction with FIG. 2. The NMOS device 474 has a source, a drain, and a gate. The source of the NMOS device 474 is electrically coupled to the second end of the termination resistor 452b. The drain the NMOS device 474 is electrically coupled to the second driver output 428. The logical element 476 has a first input which is electrically coupled to receive the inverted signal 306. The logical element 476 has a second input which is electrically coupled to receive the $N^{th}$ control signal 490. An output 480 of the logical element 476 is electrically coupled to the gate of the NMOS device 474. Power at 316 $V_{DD3}$ is supplied to the logical element 476.

In one embodiment, during operation when the first control signal is set high, whenever NMOS device 324 is on, 352 is pulled up to the reduced voltage 326 $V_L$ and NMOS device 424 necessarily pulls 428 to ground (i.e., a cross-wire configuration). Similarly, whenever NMOS device 434 is on, 428 is pulled up to the reduced voltage 326 $V_L$ and NMOS device 314 necessarily pulls 352 to ground. When a particular driver output, i.e., 352 or 428 is pulled high, to the reduced voltage 326 $V_L$, there is a current draw until 352, 428 reaches a quiescent voltage with reduced voltage 326 $V_L$. But, there is not a continuous draw of current to ground as in the case of a system with terminating resistors. Thus, architecture for obtaining a low power programmable output impedance for a driver is described using embodiments of the invention for the differential configuration of FIG. 4.

In various embodiments, the driver 400 is implemented in an integrated circuit device, which may include an integrated circuit package containing the integrated circuit. In some embodiments, the driver 400 is implemented in a single integrated circuit die. In other embodiments, the driver 400 is implemented in more than one integrated circuit die of an integrated circuit device which may include a multi-chip package containing the integrated circuit.

Figure 5:
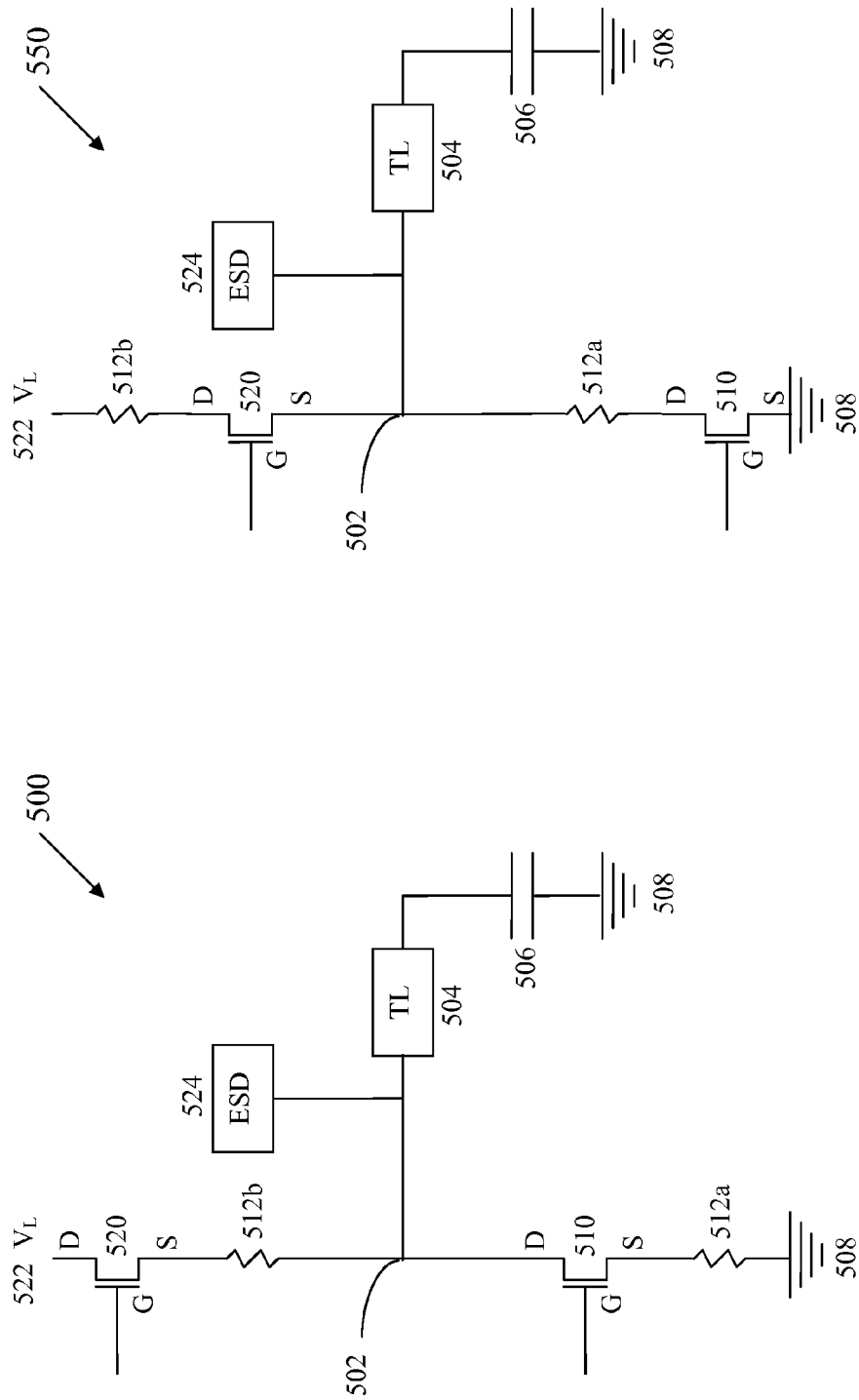
FIG. 5 illustrates two alternative circuit configurations utilizing an electrostatic discharge device (ESD), according to embodiments of the invention.

FIG. 5 illustrates two alternative circuit configurations utilizing an electrostatic discharge device (ESD), according to embodiments of the invention. With reference to FIG. 5 at 500 an alternative embodiment is illustrated for one programmable driver leg. The pull-down half of the programmable driver leg is configured as previously described with a drain of an NMOS device 510 electrically coupled to a driver output 502. The source of the NMOS device 510 is electrically coupled to a second end of a termination resistor 512a and the first end of the termination resistor 512a is electrically coupled to an internal ground 508. The pull-up half is configured differently from the pull-down half.

In the pull-up half, a second end of a termination resistor 512b is electrically coupled to the driver output 502. A source of an NMOS device 520 is electrically coupled to the first end of the termination resistor 512b. A drain of the NMOS device 520 is electrically coupled to a supply voltage 522 $V_L$. A transmission line 504 is electrically coupled to the driver output 502. The other end of the transmission line 504 is electrically coupled to capacitive load 506 and to the internal ground 508. An electrostatic discharge device (ESD) 524 is electrically coupled to the driver output 502 to protect against damage from high voltage events such as electrostatic discharge. In various embodiments, the ESD 524 is realized with a diode or a metal oxide semiconductor device (MOS) device can also be used to provide the ESD function.

With reference to FIG. 5 at 550 another alternative embodiment is illustrated for one programmable driver leg. In the configuration illustrated at 550 within the pull-down half of the programmable driver leg one end of the termination resistor 512a is electrically coupled to the driver output 502. The other end of the termination resistor 512a is electrically coupled to the drain of the NMOS device 510. The source of the NMOS device 510 is electrically coupled to the internal ground 508. Within the pull-up half of the programmable driver leg, the source of NMOS device 520 is electrically coupled to the drive output 502. A drain of the NMOS device 520 is electrically coupled to the second end of the termination resistor 512b. The first end of the termination resistor 512b is electrically coupled to the supply voltage 522 $V_L$. Due to the direct electrical coupling of the termination resistor 512a to the driver output 502 an ESD device 524 is electrically coupled to the transmission line 504 to protect against electrostatic discharge. As described above, in various embodiments, the ESD 524 is realized with a diode or a metal oxide semiconductor device (MOS) device can also be used to provide the ESD function.

Figure 6:
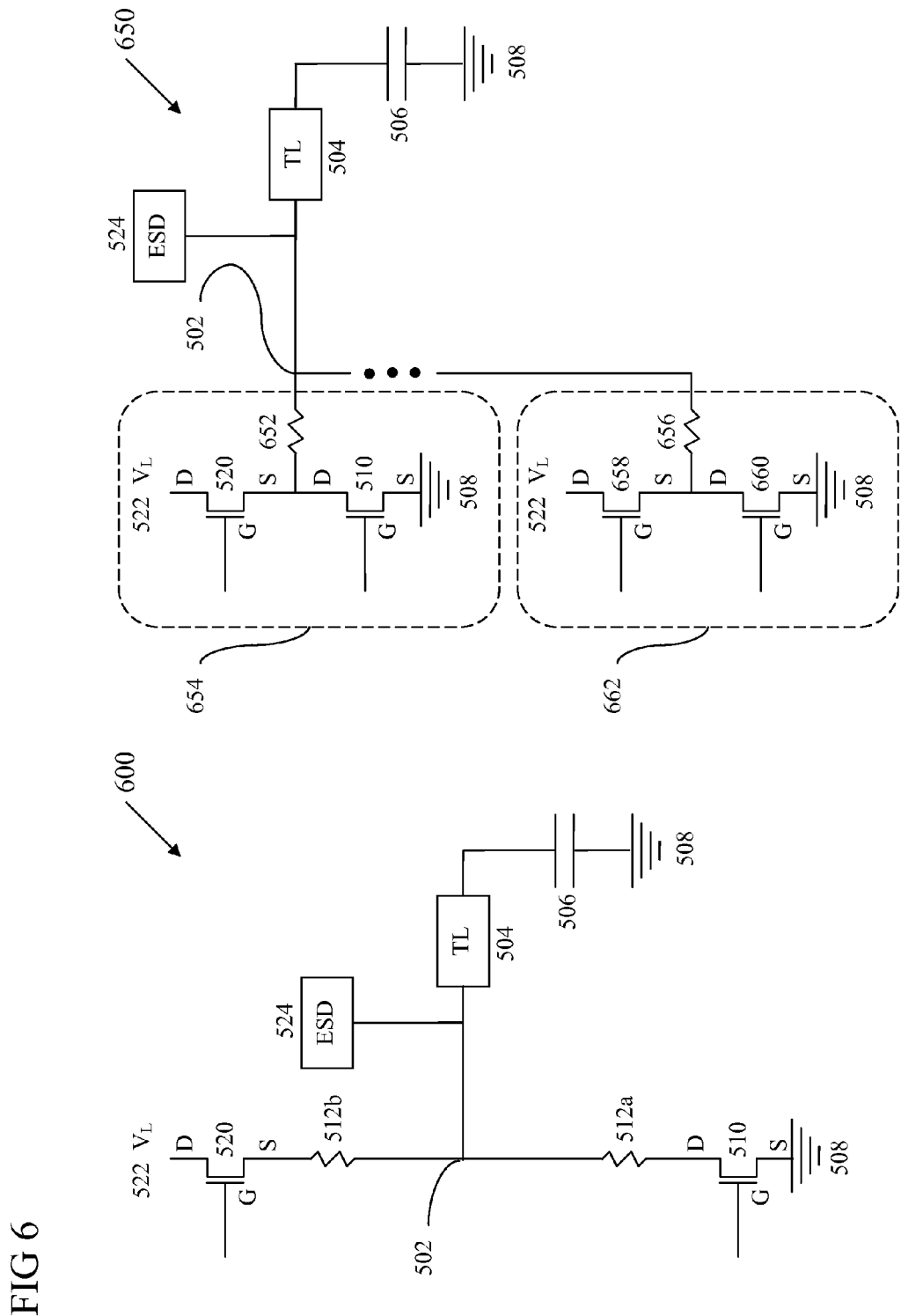
FIG. 6 illustrates another alternative circuit configuration utilizing an electrostatic discharge device (ESD), according to embodiments of the invention.

FIG. 6 illustrates other alternative circuit configurations utilizing an electrostatic discharge device (ESD), according to embodiments of the invention. Within the pull-down half of the programmable driver leg illustrated at 600, a first end of the termination resistor 512a is electrically coupled to the drain of the NMOS device 510. The second end of the termination resistor 512a is electrically coupled to the driver output 502. Within the pull-up half of the programmable driver leg, the second end of the termination resistor 512b is electrically coupled to the driver output 502. A source of the NMOS device 520 is coupled to the first end of the termination resistor 512b. In order to guard against electrostatic discharge damage, an ESD device 524 is attached to the driver output 502. The ESD device can be realized with a diode or a metal oxide semiconductor (MOS) device can also be used to provide the ESD function. As used within this detailed description of embodiments, terms such as a first end and a second end of a termination resistor are synonymous with an end and the other end of a termination resistor and are used interchangeably herein.

With reference to FIG. 6 at 650, another alternative embodiment is illustrated for a general number of N programmable driver legs, where the $N^{th}$ leg is indicated at 662. A first programmable driver leg 654 includes a pull-down half and a pull-up half. Within the pull-down half of the first programmable driver leg 654, a source of the first NMOS device 510 is electrically coupled to the internal ground 508. A drain of the first NMOS device 510 is electrically coupled to a first end of a termination resistor 652. Within the pull-up half of the first programmable driver leg 654 a source of the second NMOS device 520 is electrically coupled to the first end of the termination resistor 652. A drain of the second NMOS device 520 is electrically coupled to the supply voltage 522 $V_L$. A second end of the termination resistor is electrically coupled to the first driver output. In order to guard against damage from electrostatic discharge, an ESD device 524 is attached to the driver output 502. The ESD device can be realized with a diode or a metal oxide semiconductor (MOS) device can also be used to provide the ESD function.

The N$^{th}$ programmable driver leg is indicated at 662 and includes an NMOS device 660, an NMOS device 658, and a termination resistor 656 configured and electrically coupled together as described above for the first programmable driver leg 654. Note that in the programmable driver legs illustrated at 650 only one termination resistor is used with the pull-up half and the pull-down half of each programmable driver leg.

Figure 7:
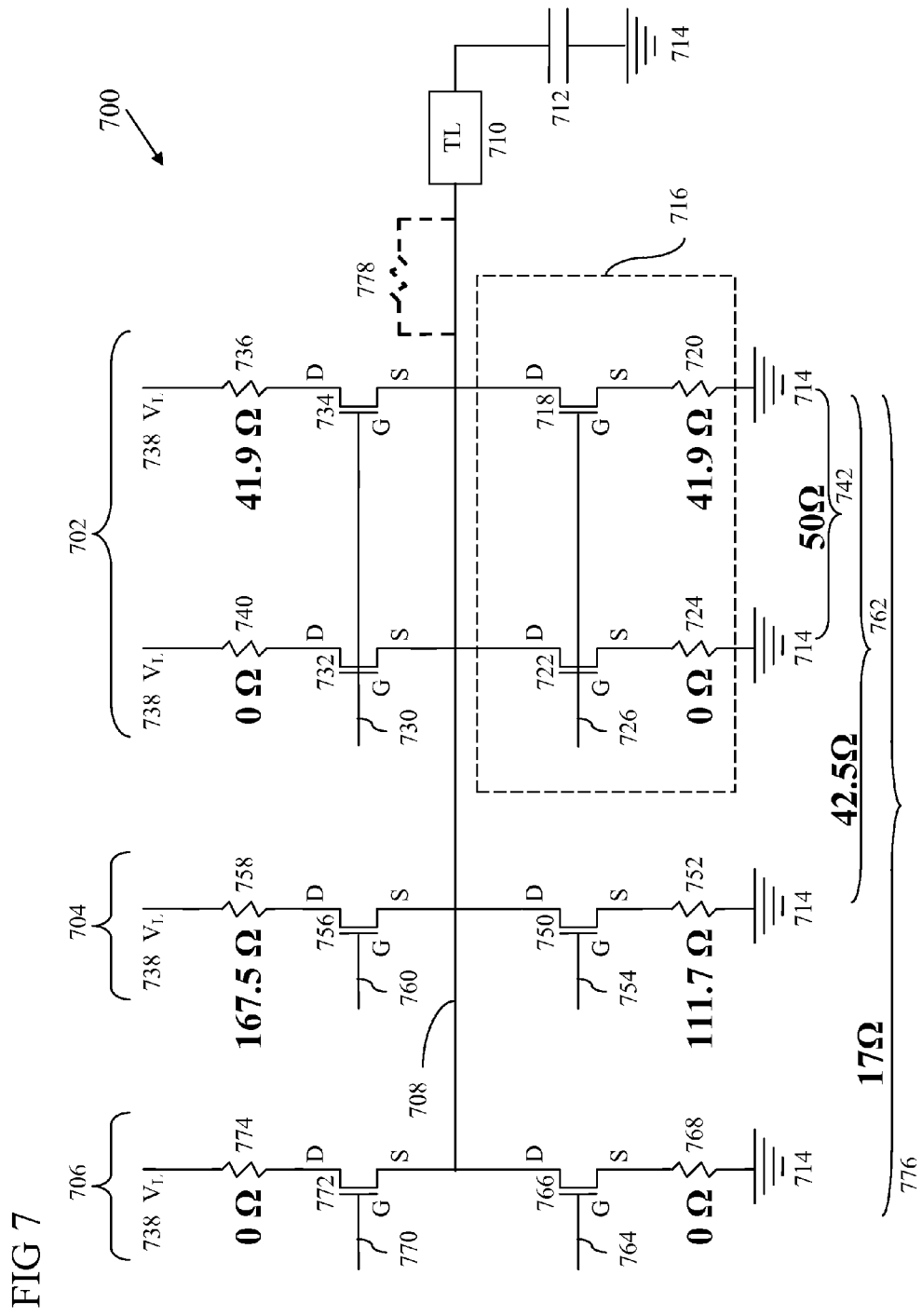
FIG. 7 illustrates a non-limiting example of programmable output impedances utilizing three driver legs, according to embodiments of the invention.

The alternative circuit configurations described in FIG. 5 at 500, 550 and in FIG. 6 at 600 and 650 can be used in any of the drivers previously described, such as 100 in FIG. 1, 300 in FIG. 3, 400 in FIG. 4, and 700 in FIG. 7. No limitation is implied and substitution of these alternative configurations is freely accomplished into any of the drivers described herein.

FIG. 7 illustrates a non-limiting example of programmable output impedances utilizing three driver legs, according to embodiments of the invention. With reference to FIG. 7, a driver 700 includes three programmable driver legs 702, 704, and 706 to create an output impedance for the driver output at 708. One end of a transmission line 710 is electrically coupled to the driver output at 708. The other end of the transmission line 710 is electrically coupled to a capacitive load 712 and an internal ground at 714.

The first programmable driver leg has a pull-down half which includes an NMOS device 718 having a drain, a source, and a gate, and an NMOS device 722 having a drain, a source, and a gate. The source of NMOS device 718 is electrically coupled to a termination resistor 720 having a value of 41.9 ohms. An output 726 of a logical element (not shown) is electrically coupled to a gate of an NMOS device 722 and the gate of the NMOS device 718. Resistor 724 is not present and is represented by a value of zero. A drain from the NMOS device 722 is electrically coupled to the driver output 708. Similarly, in the pull-up half of the first programmable driver leg, an output 730 from a logical element (not shown) is electrically coupled to a gate of an NMOS device 732 and a gate of an NMOS device 734. A source of the NMOS device 734 and a source of the NMOS device 732 are electrically coupled to the driver output 708. A drain of the NMOS device 734 is electrically coupled to one end of a termination resistor 736 having a value of 41.9 ohms. The other end of the termination resistor 736 is electrically coupled to a supply voltage 738 V$_L$. Resistor 740 is not present and is represented by a value of zero. Resistors 724 and 740 have been excluded from the circuit in order to tune the impedance of the first programmable driver leg to 50 ohms as indicated at 742. The NMOS device 722 (by itself without termination resistor 724) makes a contribution to the resistance of first programmable driver leg 702, thereby allowing the desired 50 ohms to be achieved. The same applies in the pull-up half of the first programmable driver leg where the resistance of the NMOS device 732 contributed to the impedance of the pull-up half providing the desired 50 ohms.

The second programmable driver leg 704 has a pull-down half and a pull-up half. The pull-down half of second programmable driver leg 704 includes an NMOS device 750 having a drain, a source, and a gate. The drain of NMOS device 750 is electrically coupled to the driver output 708. The source of the NMOS device 750 is electrically coupled to one end of the termination resistor 752 having a value of 111.7 ohms. The other end of the termination resistor 752 is electrically coupled to the internal ground 714. An output 754 from a logical element (not shown) is electrically coupled to a gate of the NMOS device 750. When the output 754 is high the NMOS device 750 closes pulling the driver output to ground at 714. When the output 754 of the logical element (not shown) is low the NMOS device 750 is open. Similarly, the pull-up half of second programmable driver leg 704 includes an NMOS device 756 having a drain, a source, and a gate. The source of NMOS device 756 is electrically coupled to the driver output 708. The drain of the NMOS device 756 is electrically coupled to one end of the termination resistor 758 having a value of 167.5 ohms. The other end of the termination resistor 758 is electrically coupled to the supply voltage 738 V$_L$. An output 760 from a logical element (not shown) is electrically coupled to a gate of the NMOS device 756. When the output 760 is high, the NMOS device 756 closes pulling the driver output to the supply voltage at 738 V$_L$. When the output 760 of the logical element (not shown) is low the NMOS device 756 is open.

The third programmable driver leg 706 has a pull-down half and a pull-up half. The pull-down half includes an NMOS device 766 having a drain, a source, and a gate. The drain of NMOS device 766 is electrically coupled to the driver output 708. The termination resistor 768 is not present. Similarly, the pull-up half of the third programmable driver leg includes an NMOS device 772 having a drain, a source, and a gate. The source of NMOS device 772 is electrically coupled to the driver output 708. The termination resistor 774 is not present. The termination resistors 768 and 774 have been excluded from the third programmable driver leg in order to achieve the desired value of 17 ohms which is achieved when all three driver legs are turned on by their respective logical elements outputs i.e., 764, 754, 726, 730, 760, and 770. In some applications, an optional off chip resistor 778 is utilized to terminate the driver output impedance or contribute to the driver output impedance. In various embodiments, the optional off chip resistor 778 can be used with any of the driver configurations previously illustrated in FIGS. 1, 3, 4A-4B, 5, and 6, thereby either terminating the driver output impedance or contributing to the driver output impedance.

The specific values illustrated in conjunction with FIG. 7 are a non-limiting example of one IC and do not limit embodiments of the invention. In other specific applications, one or more termination resistors can be left out in order to achieve the desired programmable termination impedances.

As described above embodiments of the invention are used to terminate single ended transmission lines. Non-limiting examples of the termination impedance for single ended transmission lines are 17 ohms, 42.5 ohms, and 50 ohms. Corresponding values for a differential transmission line are 34 ohms, 85 ohms, and 100 ohms.

Figure 8:
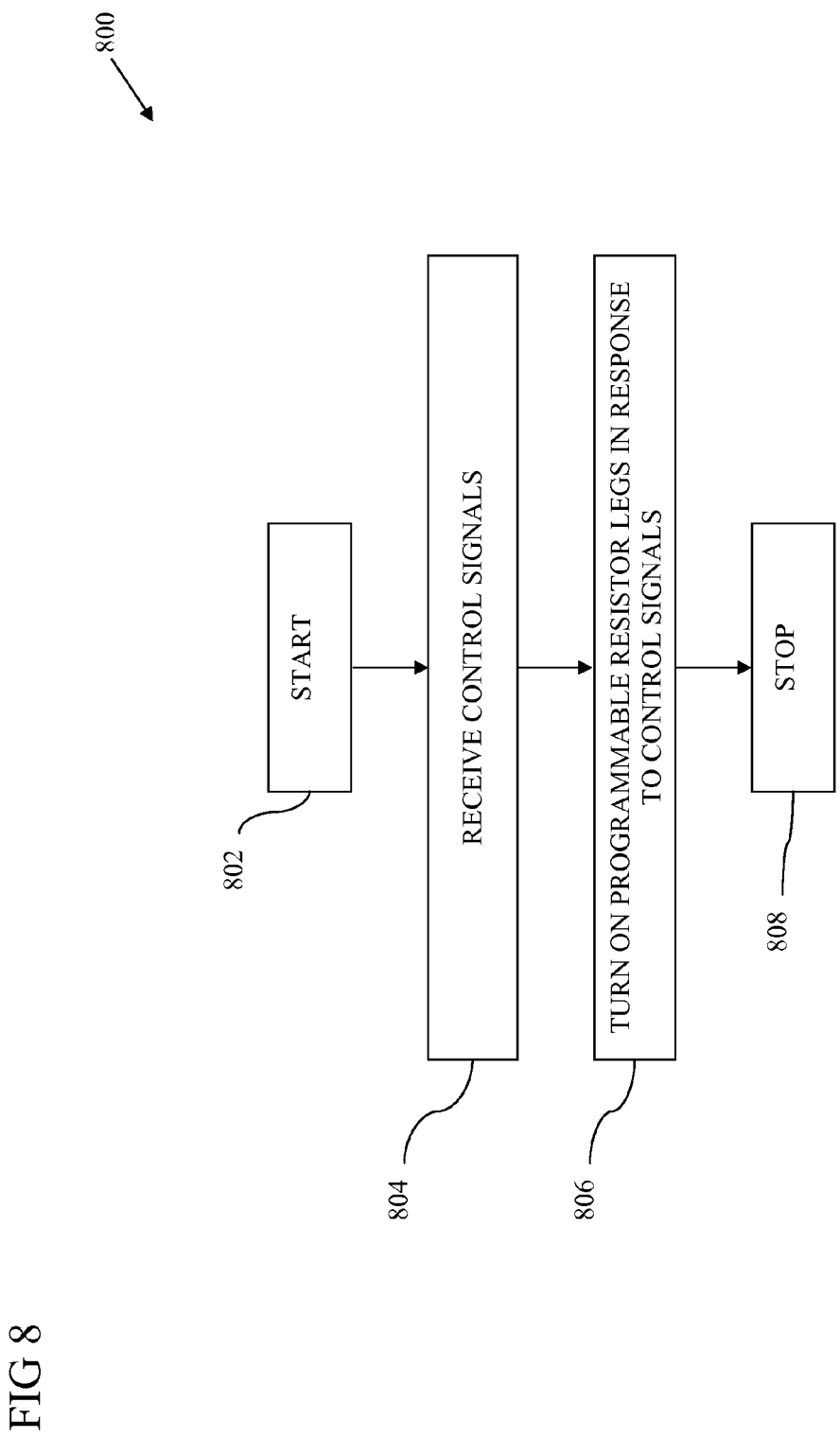
FIG. 8 illustrates a process for programming a programmable output impedance of a driver, according to embodiments of the invention.

FIG. 8 illustrates, generally at 800, a process for programming a programmable output impedance of a driver, according to embodiments of the invention. With reference to FIG. 8, a process begins at a block 802. At a block 804 a control signal(s) is received at a programmable driver leg(s) of a driver with programmable output impedance. Drivers with programmable driver legs suitable for use with process 804 are for example, 100 (FIG. 1), 300 (FIG. 3), and 400 (FIG. 4) including driver architectures that use the alternative circuit configurations described in FIG. 5 and FIGS. 6 and 700 in FIG. 7. At a process 806 a programmable driver leg(s) turns on the resistor(s) which is to contribute to forming an output impedance of a driver. The process 806 has been described above in conjunction with the functionality of the driver leg(s) in response to a control signal(s). The process stops at a block 808.

Figure 9:
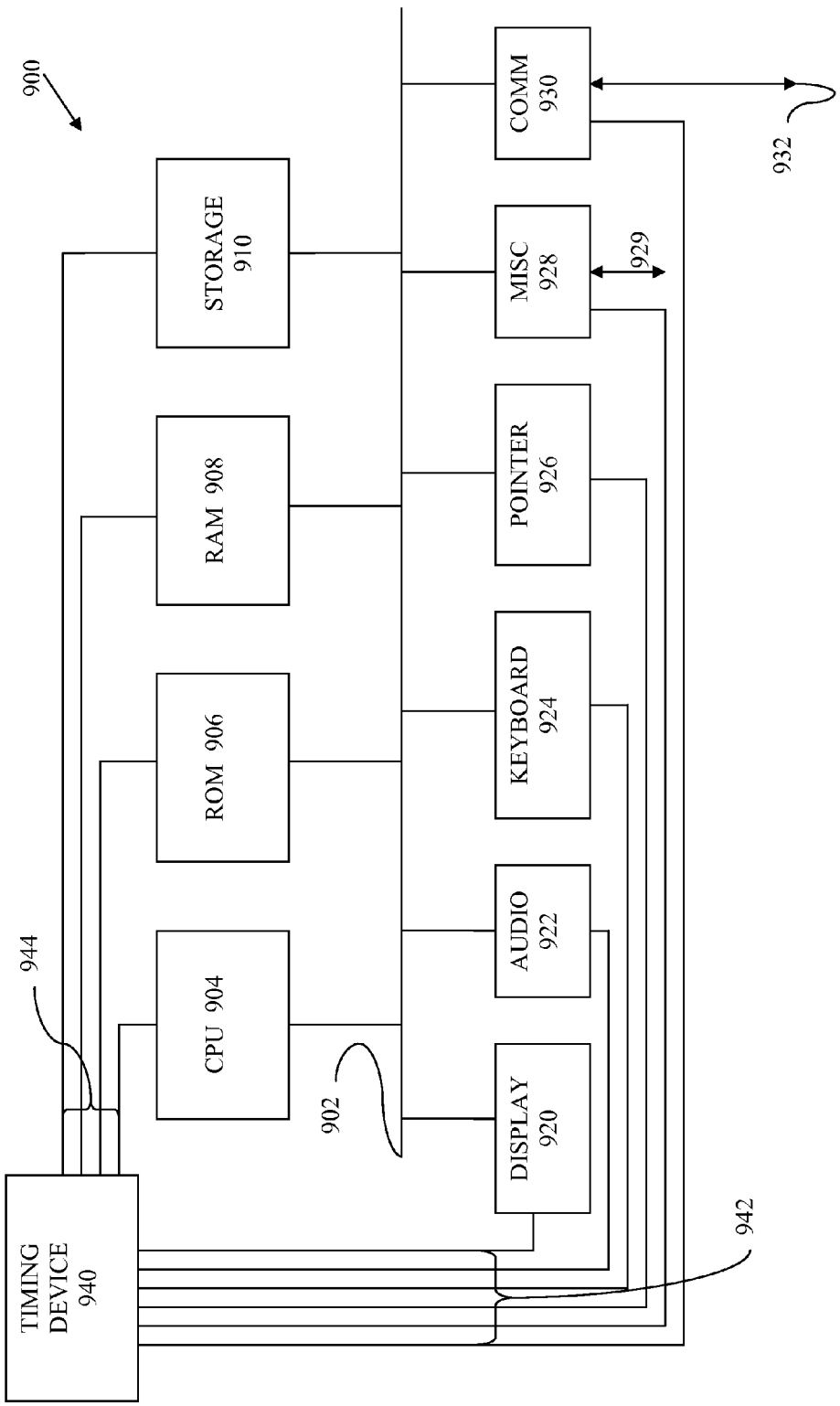
FIG. 9 illustrates a block diagram of an embodiment of a host processor, which can be referred to as a computer system (data processing device such as a computer, smart phone, tablet computer, etc.) in which embodiments of the invention may be used.

FIG. 9 illustrates a block diagram of an embodiment of a host processor, which can be referred to as a computer system (data processing device such as a computer, smart phone, tablet computer, etc.) in which embodiments of the invention may be used. The block diagram is a high level conceptual representation and may be implemented in a variety of ways and by various architectures. Bus system 902 interconnects a Central Processing Unit (CPU) 904, Read Only Memory (ROM) 906, Random Access Memory (RAM) 908, storage 910, display 920, audio, 922, keyboard 924, pointer 926, miscellaneous input/output (I/O) devices 928, and communications 930. The bus system 902 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 994 (FireWire), Universal Serial Bus (USB), etc. The CPU 904 may be a single, multiple, or even a distributed computing resource. Storage 910 may be Compact Disc (CD), Digital Versatile Disk (DVD), hard disks (HD), solid state disk (SSD), optical disks, tape, flash, memory sticks, video recorders, etc. A timing device 940 is electrically coupled as indicated by 942 and 944 to the aforementioned components, e.g., 904, 906, 908, 910, 920, 922, 924, 926, 928 and 930. Embodiments of the invention may be used in components of FIG. 9 such as in an output driver of the timing device 940. Timing device 940 is described below in conjunction with FIG. 10. Note that depending upon the actual implementation of a computer system, the computer system may include some, all, more, or a rearrangement of components in the block diagram. Thus, many variations on the system of FIG. 9 are possible.

Connection with a network is obtained with 932 via 930, as is recognized by those of skill in the art, which enables the data processing device 900 to communicate with devices in remote locations. 932 and 930 flexibly represent communication elements in various implementations, and can represent various forms of telemetry, GPRS, Internet, and combinations thereof.

In various embodiments, a pointing device such as a stylus is used in conjunction with a touch screen, for example, via 929 and 928.

Figure 10:
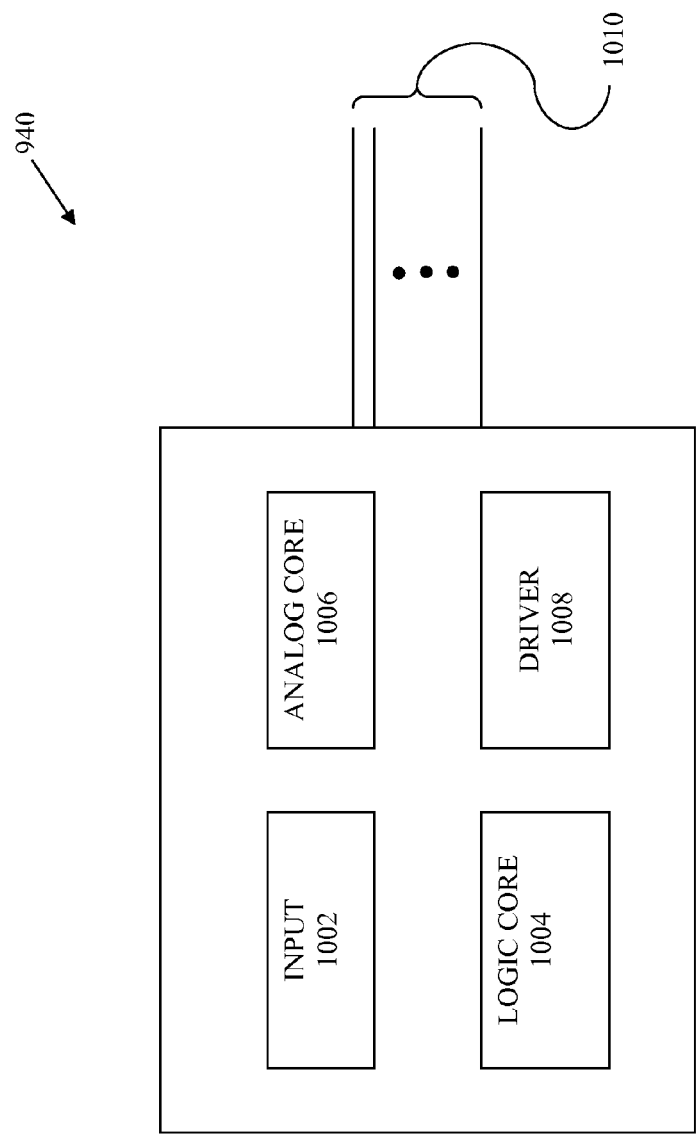
FIG. 10 illustrates a block diagram of a timing device according to embodiments of the invention.

FIG. 10 illustrates a block diagram of a timing device according to embodiments of the invention. With reference to FIG. 10, a timing device 940 includes a clock circuit which can include an input block 1002, a logic core 1004, an analog core 1006, and a driver 1008. The input block 1002 includes an input buffer and can include an ESD structure(s). The input block 1002 steers signals to the logic core 1004 or the analog core 1006. The input block 1002 also steers a reference signal to the analog core 1006. The logic core 1004 processes the input signal along with internal states of the timing device to control the analog core 1006 and the driver 1008. The analog core 1006 synthesizes an output signal based on the reference signal and control signals from the logic core 1004 and the input block 1002. The analog core 1006 may include a phase locked loop (PLL), a crystal oscillator(s), level shifters, and other analog blocks and logic needed for the operation of the analog core 1006. The driver 1008 drives the synthesized signal from the analog core 1006 to the outside of the timing device for general use at 1010. As described in the preceding figures above, an output impedance of the driver 1008 is programmed with the control signals 1004 by turning on one or more programmable driver legs. Timing device 940 is also known in the art as a clock. The terms timing device and clock can be used interchangeably herein. The terms clock signal and timing signal can also be used interchangeably herein. The term clock circuit can be used interchangeably with timing circuit. The clock 940 has a plurality of outputs 1010 that contain the clock signal. In various embodiments, such as in conjunction with the data processing system illustrated in FIG. 9, outputs 1010 are used at 942 and 944 to provide a clock signal to the components of the data processing system 900. In other embodiments, outputs 1010 from the timing device 940 are used in other applications, no limitation is implied by the example provided in FIG. 9.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods herein may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

Non-transitory machine-readable media is understood to include any mechanism for storing information in a form readable by a machine (e.g., a computer). For example, a machine-readable medium, synonymously referred to as a computer-readable medium, includes read only memory (ROM); random access memory (RAM); magnetic disk storage media; optical storage media; flash memory devices; except electrical, optical, acoustical or other forms of transmitting information via propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

While the invention has been described in terms of several embodiments, those of skill in the art will recognize that the invention is not limited to the embodiments described, but can be practiced with modification and alteration within the spirit and scope of the appended claims. The description is thus to be regarded as illustrative instead of limiting.

What is claimed is:

1. A programmable low power driver, comprising:
   a first driver output;
   a first programmable driver leg having a pull-up half and a pull-down half, the pull-up half is electrically coupled between a supply voltage and the first driver output, the pull-up half is electrically coupled to receive a signal and a first control signal, the pull-down half is electrically coupled between an internal ground and the first driver output, the pull-down half is electrically coupled to receive an inversion of the signal and the first control signal;
   a second programmable driver leg having a pull-up half and a pull-down half, the pull-up half is electrically coupled between the supply voltage and the first driver output, the pull-up half is electrically coupled to receive the signal and a second control signal, the pull-down half is electrically coupled between the internal ground and the first driver output, the pull-down half is electrically coupled to receive the inversion of the signal and the second control signal;
   the first programmable driver leg contributes to an output impedance of the first driver output when the first control signal is high and does not contribute to the output impedance of the first driver output when the first control signal is low; and
   the second programmable driver leg contributes to the output impedance of the first driver output when the second control signal is high and does not contribute to the output impedance of the first driver output when the second control signal is low.

2. The programmable low power driver of claim 1, the pull-down half of the first programmable driver leg further comprising:
   a first termination resistor having a first end and a second end, the first end is electrically coupled to the internal ground;
   a first logical element, having a first input, a second input, and an output, the first input is electrically coupled to receive the inverted signal and the second input is electrically coupled to receive the first control signal; and a first NMOS device having a source, a drain, and a gate, the gate is electrically coupled to the output of the first logical element, the drain is electrically coupled to the first driver output and the source is electrically coupled to the second end of the first termination resistor; and the pull-up half of the first programmable driver leg further comprising:

a second termination resistor having a first end and a second end, the first end is electrically coupled to a supply voltage;

a second logical element, having a first input, a second input, and an output, the first input is electrically coupled to receive the signal and the second input is electrically coupled to receive the first control signal; and a second NMOS device having a source, a drain, and a gate, the gate is connected to the output of the second logical element, the drain is electrically coupled to the second end of the second termination resistor, the source is electrically coupled to the first driver output, the pull-down half of the second programmable driver leg further comprising:

a third termination resistor having a first end and a second end, the first end is electrically coupled to the internal ground;

a third logical element, having a first input, a second input, and an output, the first input is electrically coupled to receive the inverted signal and the second input is electrically coupled to receive the second control signal; and a third NMOS device having a source, a drain, and a gate, the gate is connected to the output of the third logical element, the drain is electrically coupled to the first driver output and the source is electrically coupled to the second end of the third termination resistor; and the pull-up half of the second programmable driver leg further comprising:

a fourth termination resistor having a first end and a second end, the first end is electrically coupled to the supply voltage;

a fourth logical element, having a first input, a second input, and an output, the first input is electrically coupled to receive the signal and the second input is electrically coupled to receive the second control signal; and a fourth NMOS device having a source, a drain, and a gate, the gate is connected to the output of the fourth logical element, the drain is electrically coupled to the second end of the fourth termination resistor, the source is electrically coupled to the first driver output.

3. The programmable low power driver of claim 2, further comprising:

a second driver output;

a third programmable driver leg having a pull-up half and a pull-down half, the pull-up half is electrically coupled between the supply voltage and the second driver output, the pull-up half is electrically coupled to receive the inversion of the signal and the first control signal, the pull-down half is electrically coupled between the internal ground and the second driver output, the pull-down half is electrically coupled to receive the signal and the first control signal;

a fourth programmable driver leg having a pull-up half and a pull-down half, the pull-up half is electrically coupled between the supply voltage and the second driver output, the pull-up half is electrically coupled to receive the inversion of the signal and the second control signal, the pull-down half is electrically coupled between the internal ground and the second driver output, the pull-down half is electrically coupled to receive the signal and the second control signal;

the third programmable driver leg contributes to an output impedance of the second driver output when the first control signal is high and does not contribute to the output impedance of the second driver output when the first control signal is low; and the fourth programmable driver leg contributes to the output impedance of the second driver output when the second control signal is high and does not contribute to the output impedance of the second driver output when the second control signal is low.

4. The programmable low power driver of claim 3, the pull-down half of the third programmable driver leg further comprising:

a fifth termination resistor having a first end and a second end, the first end is electrically coupled to the internal ground;

a fifth logical element, having a first input, a second input, and an output, the first input is electrically coupled to receive the signal and the second input is electrically coupled to receive the second control signal; and a fifth NMOS device having a source, a drain, and a gate, the gate is connected to the output of the fifth logical element, the drain is electrically coupled to the second driver output and the source is electrically coupled to the second end of the fifth termination resistor; and the pull-up half of the third programmable driver leg further comprising:

a sixth termination resistor having a first end and a second end, the first end is electrically coupled to the supply voltage;

a sixth logical element, having a first input, a second input, and an output, the first input is electrically coupled to receive the signal and the second input is electrically coupled to receive the first control signal; and a sixth NMOS device having a source, a drain, and a gate, the gate is connected to the output of the sixth logical element, the source is electrically coupled to the second end of the sixth termination resistor, the drain is electrically coupled to the second driver output, the pull-down half of the fourth programmable driver leg further comprising:

a seventh termination resistor having a first end and a second end, the first end is electrically coupled to the internal ground;

a seventh logical element, having a first input, a second input, and an output, the first input is electrically coupled to receive the inverted signal and the second input is electrically coupled to receive the second control signal; and a seventh NMOS device having a source, a drain, and a gate, the gate is connected to the output of the seventh logical element, the drain is electrically coupled to the second driver output and the source is electrically coupled to the second end of the seventh termination resistor; and the pull-up half of the fourth programmable driver leg further comprising:

an eighth termination resistor having a first end and a second end, the first end is electrically coupled to the supply voltage;

an eighth logical element, having a first input, a second input, and an output, the first input is electrically coupled to receive the inverted signal and the second input is electrically coupled to receive the second control signal; and an eighth NMOS device having a source, a drain, and a gate, the gate is connected to the output of the eighth logical element, the source is electrically coupled to the second end of the eighth termination resistor, the drain is electrically coupled to the second driver output.

5. The programmable low power driver of claim 4, wherein the signal is a clock signal.

6. The programmable low power driver of claim 1, further comprising:

an electrostatic discharge device (ESD) the ESD is coupled to the first driver output, the pull-down half of the first programmable driver leg further comprising:

a first termination resistor having a first end and a second end, the first end is electrically coupled to the internal ground;

a first logical element, having a first input, a second input, and an output, the first input is electrically coupled to receive the inverted signal and the second input is electrically coupled to receive the first control signal; and a first NMOS device having a source, a drain, and a gate, the gate is connected to the output of the first logical element, the drain is electrically coupled to the first driver output and the source is electrically coupled to the second end of the first termination resistor; and the pull-up half of the first programmable driver leg further comprising:

a second termination resistor having a first end and a second end, the second end is electrically coupled to the first driver output;

a second logical element, having a first input, a second input, and an output, the first input is electrically coupled to receive the signal and the second input is electrically coupled to receive the first control signal; and a second NMOS device having a source, a drain, and a gate, the gate is connected to the output of the second logical element, the source is electrically coupled to the first end of the second termination resistor, the drain is electrically coupled to the supply voltage, the pull-down half of the second programmable driver leg further comprising:

a third termination resistor having a first end and a second end, the first end is electrically coupled to the internal ground;

a third logical element, having a first input, a second input, and an output, the first input is electrically coupled to receive the inverted signal and the second input is electrically coupled to receive the second control signal; and a third NMOS device having a source, a drain, and a gate, the gate is connected to the output of the third logical element, the drain is electrically coupled to the first driver output and the source is electrically coupled to the second end of the third termination resistor; and the pull-up half of the second programmable driver leg further comprising:

a fourth termination resistor having a first end and a second end, the first end is electrically coupled to the first driver output;

a fourth logical element, having a first input, a second input, and an output, the first input is electrically coupled to receive the signal and the second input is electrically coupled to receive the second control signal; and a fourth NMOS device having a source, a drain, and a gate, the gate is connected to the output of the fourth logical element, the source is electrically coupled to the second end of the fourth termination resistor, the drain is electrically coupled to the supply voltage.

7. The programmable low power driver of claim 6, further comprising:

a second driver output;

a third programmable driver leg having a pull-up half and a pull-down half, the pull-up half is electrically coupled between the supply voltage and the second driver output, the pull-up half is electrically coupled to receive the signal and the first control signal, the pull-down half is electrically coupled between the internal ground and the second driver output, the pull-down half is electrically coupled to receive the inversion of the signal and the first control signal;

a fourth programmable driver leg having a pull-up half and a pull-down half, the pull-up half is electrically coupled between the supply voltage and the second driver output, the pull-up half is electrically coupled to receive the signal and the second control signal, the pull-down half is electrically coupled between the internal ground and the second driver output, the pull-down half is electrically coupled to receive the inversion of the signal and the second control signal;

the third programmable driver leg contributes to a termination impedance of the second driver output when the first control signal is high and does not contribute to the termination impedance of the second driver output when the first control signal is low; and the fourth programmable driver leg contributes to the termination impedance of the second driver output when the second control signal is high and does not contribute to the termination impedance of the second driver output when the second control signal is low.

8. The programmable low power driver of claim 7, the pull-down half of the third programmable driver leg further comprising:

a fifth termination resistor having a first end and a second end, the first end is electrically coupled to the internal ground;

a fifth logical element, having a first input, a second input, and an output, the first input is electrically coupled to receive the inverted signal and the second input is electrically coupled to receive the first control signal; and a fifth NMOS device having a source, a drain, and a gate, the gate is connected to the output of the fifth logical element, the drain is electrically coupled to the second driver output and the source is electrically coupled to the second end of the fifth termination resistor; and the pull-up half of the third programmable driver leg further comprising:

a sixth termination resistor having a first end and a second end, the second end is electrically coupled to the second driver output;

a sixth logical element, having a first input, a second input, and an output, the first input is electrically coupled to receive the signal and the second input is electrically coupled to receive the first control signal; and a sixth NMOS device having a source, a drain, and a gate, the gate is connected to the output of the sixth logical element, the source is electrically coupled to the first end of the sixth termination resistor, the drain is electrically coupled to the supply voltage, the pull-down half of the fourth programmable driver leg further comprising:
a seventh termination resistor having a first end and a second end, the first end is electrically coupled to the internal ground;
a seventh logical element, having a first input, a second input, and an output, the first input is electrically coupled to receive the inverted signal and the second input is electrically coupled to receive the second control signal; and
a seventh NMOS device having a source, a drain, and a gate, the gate is connected to the output of the seventh logical element, the drain is electrically coupled to the second driver output and the source is electrically coupled to the second end of the seventh termination resistor; and the pull-up half of the fourth programmable driver leg further comprising:
an eighth termination resistor having a first end and a second end, the second end is electrically coupled to the second driver output;
an eighth logical element, having a first input, a second input, and an output, the first input is electrically coupled to receive the inverted signal and the second input is electrically coupled to receive the second control signal; and
an eighth NMOS device having a source, a drain, and a gate, the gate is connected to the output of the eighth logical element, the source is electrically coupled to the first end of the eighth termination resistor, the drain is electrically coupled to the supply voltage.

9. The programmable low power driver of claim 1, further comprising:
an electrostatic discharge device (ESD) the ESD is coupled to the first driver output, the pull-down half of the first programmable driver leg further comprising:
a first termination resistor having a first end and a second end, the second end is electrically coupled to the first driver output;
a first logical element, having a first input, a second input, and an output, the first input is electrically coupled to receive the inverted signal and the second input is electrically coupled to receive the first control signal; and
a first NMOS device having a source, a drain, and a gate, the gate is connected to the output of the first logical element, the drain is electrically coupled to the first end of the first termination resistor and the source is electrically coupled to the internal ground; and the pull-up half of the first programmable driver leg further comprising:
a second termination resistor having a first end and a second end, the first end is electrically coupled to a supply voltage;
a second logical element, having a first input, a second input, and an output, the first input is electrically coupled to receive the signal and the second input is electrically coupled to receive the first control signal; and
a second NMOS device having a source, a drain, and a gate, the gate is connected to the output of the second logical element, the drain is electrically coupled to the second end of the second termination resistor, the source is electrically coupled to the first driver output, the pull-down half of the second programmable driver leg further comprising:
a third termination resistor having a first end and a second end, the second end is electrically coupled to the first driver output;
a third logical element, having a first input, a second input, and an output, the first input is electrically coupled to receive the inverted signal and the second input is electrically coupled to receive the second control signal; and
an third NMOS device having a source, a drain, and a gate, the gate is connected to the output of the third logical element, the drain is electrically coupled to the first end of the third termination resistor and the source is electrically coupled to the internal ground; and the pull-up half of the second programmable driver leg further comprising:
a fourth termination resistor having a first end and a second end, the first end is electrically coupled to the supply voltage;
a fourth logical element, having a first input, a second input, and an output, the first input is electrically coupled to receive the signal and the second input is electrically coupled to receive the second control signal; and
a fourth NMOS device having a source, a drain, and a gate, the gate is connected to the output of the fourth logical element, the drain is electrically coupled to the second end of the fourth termination resistor, the source is electrically coupled to the first driver output.

10. The programmable low power driver of claim 9, further comprising:
a second driver output;
a third programmable driver leg having a pull-up half and a pull-down half, the pull-up half is electrically coupled between the supply voltage and the second driver output, the pull-up half is electrically coupled to receive the signal and the first control signal, the pull-down half is electrically coupled between the internal ground and the second driver output, the pull-down half is electrically coupled to receive the inversion of the signal and the first control signal;
a fourth programmable driver leg having a pull-up half and a pull-down half, the pull-up half is electrically coupled between the supply voltage and the second driver output, the pull-up half is electrically coupled to receive the signal and the second control signal, the pull-down half is electrically coupled between the internal ground and the second driver output, the pull-down half is electrically coupled to receive the inversion of the signal and the second control signal;
the third programmable driver leg contributes to an output impedance of the second driver output when the first control signal is high and does not contribute to the output impedance of the second driver output when the first control signal is low; and
the fourth programmable driver leg contributes to the output impedance of the second driver output when the second control signal is high and does not contribute to the output impedance of the second driver output when the second control signal is low.

11. The programmable low power driver of claim 10, the pull-down half of the third programmable driver leg further comprising:

a fifth termination resistor having a first end and a second end, the second end is electrically coupled to the second driver output;

a fifth logical element, having a first input, a second input, and an output, the first input is electrically coupled to receive the signal and the second input is electrically coupled to receive the first control signal; and a fifth NMOS device having a source, a drain, and a gate, the gate is connected to the output of the fifth logical element, the drain is electrically coupled to the first end of the fifth termination resistor and the source is electrically coupled to the internal ground; and the pull-up half of the third programmable driver leg further comprising:

a sixth termination resistor having a first end and a second end, the first end is electrically coupled to the supply voltage;

a sixth logical element, having a first input, a second input, and an output, the first input is electrically coupled to receive the inverted signal and the second input is electrically coupled to receive the first control signal; and a sixth NMOS device having a source, a drain, and a gate, the gate is connected to the output of the sixth logical element, the source is electrically coupled to the second end of the sixth termination resistor, the drain is electrically coupled to the second driver output, the pull-down half of the fourth programmable driver leg further comprising:

a seventh termination resistor having a first end and a second end, the second end is electrically coupled to the second driver output;

a seventh logical element, having a first input, a second input, and an output, the first input is electrically coupled to receive the signal and the second input is electrically coupled to receive the second control signal; and a seventh NMOS device having a source, a drain, and a gate, the gate is connected to the output of the seventh logical element, the drain is electrically coupled to the first end of the seventh termination resistor and the source is electrically coupled to the internal ground; and the pull-up half of the fourth programmable driver leg further comprising:

an eighth termination resistor having a first end and a second end, the first end is electrically coupled to the supply voltage;

an eighth logical element, having a first input, a second input, and an output, the first input is electrically coupled to receive the inverted signal and the second input is electrically coupled to receive the second control signal; and an eighth NMOS device having a source, a drain, and a gate, the gate is connected to the output of the eighth logical element, the source is electrically coupled to the second end of the eighth termination resistor, the drain is electrically coupled to the second driver output.

12. The programmable low power driver of claim 1, further comprising:

an electrostatic discharge device (ESD) the ESD is coupled to the first driver output, the pull-down half of the first programmable driver leg further comprising:

a first termination resistor having a first end and a second end, the second end is electrically coupled to the first driver output;

a first logical element, having a first input, a second input, and an output, the first input is electrically coupled to receive the inverted signal and the second input is electrically coupled to receive the first control signal; and a first NMOS device having a source, a drain, and a gate, the gate is connected to the output of the first logical element, the drain is electrically coupled to the second end of the first termination resistor and the source is electrically coupled to the internal ground; and the pull-up half of the first programmable driver leg further comprising:

a second termination resistor having a first end and a second end, the second end is electrically coupled to first driver output;

a second logical element, having a first input, a second input, and an output, the first input is electrically coupled to receive the signal and the second input is electrically coupled to receive the first control signal; and a second NMOS device having a source, a drain, and a gate, the gate is connected to the output of the second logical element, the drain is electrically coupled to the supply voltage, the source is electrically coupled to the first end of the second termination resistor, the pull-down half of the second programmable driver leg further comprising:

a third termination resistor having a first end and a second end, the second end is electrically coupled to the first driver output;

a third logical element, having a first input, a second input, and an output, the first input is electrically coupled to receive the inverted signal and the second input is electrically coupled to receive the second control signal; and a third NMOS device having a source, a drain, and a gate, the gate is connected to the output of the third logical element, the drain is electrically coupled to the first end of the third termination resistor and the source is electrically coupled to the internal ground; and the pull-up half of the second programmable driver leg further comprising:

a fourth termination resistor having a first end and a second end, the second end is electrically coupled to the first driver output;

a fourth logical element, having a first input, a second input, and an output, the first input is electrically coupled to receive the signal and the second input is electrically coupled to receive the second control signal; and a fourth NMOS device having a source, a drain, and a gate, the gate is connected to the output of the fourth logical element, the drain is electrically coupled to the supply voltage, the source is electrically coupled to the first end of the fourth termination resistor.

13. The programmable low power driver of claim 12, further comprising:

a second driver output;

a third programmable driver leg having a pull-up half and a pull-down half, the pull-up half is electrically coupled between the supply voltage and the second driver output, the pull-up half is electrically coupled to receive the signal and the first control signal, the pull-down half is electrically coupled between the internal ground and the second driver output, the pull-down half is electrically coupled to receive the inversion of the signal and the first control signal;

a fourth programmable driver leg having a pull-up half and a pull-down half, the pull-up half is electrically coupled between the supply voltage and the second driver output, the pull-up half is electrically coupled to receive the signal and the second control signal, the pull-down half is electrically coupled between the internal ground and the second driver output, the pull-down half is electrically coupled to receive the inversion of the signal and the second control signal;

the third programmable driver leg contributes to an output impedance of the second driver output when the first control signal is high and does not contribute to the output impedance of the second driver output when the first control signal is low; and the fourth programmable driver leg contributes to the output impedance of the second driver output when the second control signal is high and does not contribute to the output impedance of the second driver output when the second control signal is low.

14. The programmable low power driver of claim 13, the pull-down half of the third programmable driver leg further comprising:

a fifth termination resistor having a first end and a second end, the second end is electrically coupled to the second driver output;

a fifth logical element, having a first input, a second input, and an output, the first input is electrically coupled to receive the inverted signal and the second input is electrically coupled to receive the first control signal; and a fifth NMOS device having a source, a drain, and a gate, the gate is connected to the output of the fifth logical element, the drain is electrically coupled to the first end of the fifth termination resistor and the source is electrically coupled to the internal ground; and the pull-up half of the third programmable driver leg further comprising:

a sixth termination resistor having a first end and a second end, the second end is electrically coupled to the second driver output;

a sixth logical element, having a first input, a second input, and an output, the first input is electrically coupled to receive the signal and the second input is electrically coupled to receive the first control signal; and a sixth NMOS device having a source, a drain, and a gate, the gate is connected to the output of the sixth logical element, the source is electrically coupled to the first end of the sixth termination resistor, the drain is electrically coupled to the supply voltage, the pull-down half of the fourth programmable driver leg further comprising:

a seventh termination resistor having a first end and a second end, the second end is electrically coupled to the second driver output;

a seventh logical element, having a first input, a second input, and an output, the first input is electrically coupled to receive the inverted signal and the second input is electrically coupled to receive the second control signal; and a seventh NMOS device having a source, a drain, and a gate, the gate is connected to the output of the seventh logical element, the drain is electrically coupled to the first end of the seventh termination resistor and the source is electrically coupled to the internal ground; and the pull-up half of the fourth programmable driver leg further comprising:

an eighth termination resistor having a first end and a second end, the second end is electrically coupled to the second driver output;

an eighth logical element, having a first input, a second input, and an output, the first input is electrically coupled to receive the inverted signal and the second input is electrically coupled to receive the second control signal; and an eighth NMOS device having a source, a drain, and a gate, the gate is connected to the output of the eighth logical element, the source is electrically coupled to the first end of the eighth termination resistor, the drain is electrically coupled to the supply voltage.

15. A clock, comprising:

a clock circuit configured to generate a clock signal; and a programmable low power driver having a first driver output and a plurality of driver legs having different impedance, each of the plurality of driver legs electrically coupled to the clock circuit, the programmable low power driver configured to receive the clock signal and an input indicating one or more driver legs of the plurality of driver legs, the programmable low power driver configured to electrically couple the indicated one or more driver legs of the plurality of driver legs to the first driver output to generate at the first driver output an output clock signal, an impedance of the first driver output corresponding to the impedance of the indicated one or more driver legs of the plurality of driver legs.

16. The clock of claim 15, wherein the programmable low power driver includes a second driver output and a plurality of additional driver legs, each of the additional driver legs coupled to the clock circuit, the input indicating one or more driver legs of the plurality of additional driver legs, the programmable low power driver configured to couple the indicated one or more driver legs of the plurality of additional driver legs to the second driver output to generate a differential clock signal at the first driver output and the second driver output, an impedance of the second driver output corresponding to the impedance of the indicated one or more driver legs of the plurality of additional driver legs.

17. The clock of claim 16, wherein the each of the plurality of additional driver legs comprises:

a first termination resistor having a first end electrically coupled to an internal ground;

a first logical element having a first input electrically coupled to receive the clock signal and a second input electrically coupled to receive a second control signal;

a first NMOS device having a gate electrically coupled to the output of the first logical element, a drain electrically coupled to the first driver output and a source electrically coupled to a second end of the first termination resistor;

a second termination resistor having a first end electrically coupled to a supply voltage;

a second logical element having a first input electrically coupled to receive the inverted clock signal and a second input electrically coupled to receive the first control signal; and a second NMOS device having a gate electrically coupled to the output of the second logical element, a drain electrically coupled to a second end of the second termination resistor, and a source electrically coupled to the second driver output.

18. The clock of claim 15, wherein the programmable low power driver further comprises an inverter having an input and an output, the inverter configured to receive the generated clock signal and to output an inverted clock signal, wherein the inverted clock signal is an inversion of the input clock signal, each of the plurality of driver legs comprising:
- a first termination resistor having a first end electrically coupled to an internal ground;
- a first logical element having a first input electrically coupled to receive the inverted clock signal and a second input electrically coupled to receive a first control signal;
- a first NMOS device having a gate electrically coupled to the output of the first logical element, a drain electrically coupled to the first driver output and a source electrically coupled to a second end of the first termination resistor;
- a second termination resistor having a first end electrically coupled to a supply voltage;
- a second logical element having a first input electrically coupled to receive the clock signal and a second input electrically coupled to receive the first control signal; and
- a second NMOS device having a gate electrically coupled to the output of the second logical element, a drain electrically coupled to a second end of the second termination resistor, and a source electrically coupled to the first driver output.

19. The clock of claim 15, wherein the programmable low power driver further comprises an inverter having an input and an output, the inverter configured to receive the generated clock signal and to output an inverted clock signal, wherein the inverted clock signal is an inversion of the input clock signal, each of the plurality of driver legs comprising:
- a first termination resistor having a first end electrically coupled to an internal ground;
- a first logical element having a first input electrically coupled to receive the inverted clock signal and a second input electrically coupled to receive a first control signal;
- a first NMOS device having a gate electrically coupled to the output of the first logical element, a drain electrically coupled to the first driver output and a source electrically coupled to a second end of the first termination resistor;
- a second termination resistor having a first end electrically coupled to the first driver output;
- a second logical element having a first input electrically coupled to receive the clock signal and a second input electrically coupled to receive the first control signal;
- a second NMOS device having a gate electrically coupled to the output of the second logical element, a source electrically coupled to a second end of the second termination resistor, and a drain electrically coupled to the supply voltage; and
- an electrostatic discharge device electrically coupled to the first driver output.

20. The clock of claim 15, wherein the programmable low power driver further comprises an inverter having an input and an output, the inverter configured to receive the generated clock signal and to output an inverted clock signal, wherein the inverted clock signal is an inversion of the input clock signal, each of the plurality of driver legs comprising:
- a first termination resistor having a second end electrically coupled to the first driver output;
- a first logical element having a first input electrically coupled to receive the inverted clock signal and a second input electrically coupled to receive a first control signal;
- a first NMOS device having a gate electrically coupled to the output of the first logical element, a drain electrically coupled to a first end of the first termination resistor and a source electrically coupled to the internal ground;
- a second termination resistor having a first end electrically coupled to the supply voltage;
- a second logical element having a first input electrically coupled to receive the clock signal and a second input electrically coupled to receive the first control signal;
- a second NMOS device having a gate electrically coupled to the output of the second logical element, a drain electrically coupled to a second end of the second termination resistor, and a source electrically coupled to the first driver output; and
- an electrostatic discharge device electrically coupled to the first driver output.

21. The clock of claim 15, wherein the programmable low power driver further comprises an inverter having an input and an output, the inverter configured to receive the generated clock signal and to output an inverted clock signal, wherein the inverted clock signal is an inversion of the input clock signal, each of the plurality of driver legs comprising:
- a first termination resistor having a second end electrically coupled to the first driver output;
- a first logical element having a first input electrically coupled to receive the inverted clock signal and a second input electrically coupled to receive a first control signal;
- a first NMOS device having a gate electrically coupled to the output of the first logical element, a drain electrically coupled to a first end of the first termination resistor and a source electrically coupled to the internal ground;
- a second termination resistor having a first end electrically coupled to the first driver output;
- a second logical element having a first input electrically coupled to receive the clock signal and a second input electrically coupled to receive the first control signal;
- a second NMOS device having a gate electrically coupled to the output of the second logical element, a source electrically coupled to a second end of the second termination resistor, and a drain electrically coupled to the supply voltage; and
- an electrostatic discharge device electrically coupled to the first driver output.

22. The clock of claim 15, wherein the programmable low power driver further comprises an inverter having an input and an output, the inverter configured to receive the generated clock signal and to output an inverted clock signal, wherein the inverted clock signal is an inversion of the input clock signal, each of the plurality of driver legs comprising:
- a termination resistor having a second end electrically coupled to the first driver output;
- a first logical element having a first input electrically coupled to receive the inverted clock signal and a second input electrically coupled to receive a first control signal;
- a first NMOS device having a gate electrically coupled to the output of the first logical element, a drain electrically coupled to a first end of the termination resistor and a source electrically coupled to the internal ground;
- a second logical element having a first input electrically coupled to receive the clock signal and a second input electrically coupled to receive the first control signal;
- a second NMOS device having a gate electrically coupled to the output of the second logical element, a source electrically coupled to the first end of the termination resistor, and a drain electrically coupled to the supply voltage; and an electrostatic discharge device electrically coupled to the first driver output.

* * * * *